US009070670B2

(12) United States Patent
Carroll

(10) Patent No.: US 9,070,670 B2
(45) Date of Patent: Jun. 30, 2015

(54) ELECTRICAL CONNECTIVITY OF DIE TO A HOST SUBSTRATE

(71) Applicant: Robert T. Carroll, Andover, MA (US)

(72) Inventor: Robert T. Carroll, Andover, MA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 14/175,378

(22) Filed: Feb. 7, 2014

(65) Prior Publication Data
US 2014/0217565 A1 Aug. 7, 2014

Related U.S. Application Data

(63) Continuation-in-part of application No. 12/505,989, filed on Jul. 20, 2009, now Pat. No. 8,648,449.

(60) Provisional application No. 61/148,292, filed on Jan. 29, 2009, provisional application No. 61/166,149, filed on Apr. 2, 2009, provisional application No. 61/882,737, filed on Sep. 26, 2013.

(51) Int. Cl.
*H01L 23/48* (2006.01)
*H01L 23/498* (2006.01)
*H01L 23/52* (2006.01)
*H01L 23/538* (2006.01)
*H01L 21/60* (2006.01)
*H01L 23/495* (2006.01)
(Continued)

(52) U.S. Cl.
CPC ........ *H01L 23/495* (2013.01); *H01L 23/49838* (2013.01); *H01L 23/498* (2013.01); *H01L 23/49575* (2013.01); *H01L 23/49822* (2013.01); *H01L 21/486* (2013.01); *H01L 2924/00013* (2013.01); *H01L 2924/01019* (2013.01); *H01L 2924/01078* (2013.01); *H01L 2924/14* (2013.01); *H01L 2924/19042* (2013.01); *H01L 2924/3011* (2013.01); *H01L 24/13* (2013.01); *H01L 24/16* (2013.01); *H01L 2224/0401* (2013.01); *H01L 2224/131* (2013.01); *H01L 2224/16245* (2013.01); *H01L 2924/15192* (2013.01); *H01L 2924/19105* (2013.01); *H01L 23/49562* (2013.01); *H01L 2224/1415* (2013.01); *H01L 2224/05548* (2013.01); *H01L 2224/16227* (2013.01)

(58) Field of Classification Search
CPC ............ H01L 23/498; H01L 23/49822; H01L 23/49575; H01L 23/49838; H01L 21/486
See application file for complete search history.

(56) References Cited

U.S. PATENT DOCUMENTS 5,212,403 A * 5/1993 Nakanishi et al. ............ 257/664
5,654,590 A * 8/1997 Kuramochi ................... 257/778
(Continued)

*Primary Examiner* — Marvin Payen
*Assistant Examiner* — Jeremy Joy
(74) *Attorney, Agent, or Firm* — Chapin IP Law, LLC

(57) ABSTRACT

According to example configurations herein, an apparatus comprises a die and a host substrate. The die can include a first transistor and a second transistor. A surface of the die includes multiple conductive elements disposed thereon. The multiple conductive elements on the surface are electrically coupled to respective nodes of the first transistor and the second transistor. Prior to assembly, the first transistor and second transistor are electrically isolated from each other. During assembly, the surface of the die including the respective conductive elements is mounted on a facing of the host substrate. Accordingly, a die including multiple independent transistors can be flipped and mounted to a respective host substrate such as printed circuit board, lead frame, etc.

24 Claims, 21 Drawing Sheets

(51) Int. Cl.
*H01L 21/48* (2006.01)
*H01L 23/00* (2006.01)

(56) References Cited

U.S. PATENT DOCUMENTS

| | | | |
|---|---|---|---|
| 6,362,525 B1 * | 3/2002 | Rahim | 257/738 |
| 6,373,125 B1 | 4/2002 | Pannaccione | |
| 6,462,522 B2 | 10/2002 | Burstein | |
| 6,482,680 B1 | 11/2002 | Khor | |
| 6,713,823 B1 | 3/2004 | Nickel | |
| 6,737,301 B2 | 5/2004 | Eden | |
| 6,972,464 B2 | 12/2005 | Shen | |
| 7,015,575 B2 | 3/2006 | Suenaga | |
| 7,019,337 B2 | 3/2006 | Eden | |
| 7,855,397 B2 | 12/2010 | Alley | |
| 8,085,553 B1 * | 12/2011 | Lacap et al. | 361/813 |
| 8,159,032 B2 * | 4/2012 | Schnitt et al. | 257/355 |
| 2002/0071293 A1 * | 6/2002 | Eden et al. | 363/20 |
| 2004/0256717 A1 * | 12/2004 | Suenaga et al. | 257/700 |
| 2009/0072385 A1 * | 3/2009 | Alley et al. | 257/713 |
| 2010/0044860 A1 * | 2/2010 | Haba et al. | 257/737 |
| 2010/0213589 A1 * | 8/2010 | Hsieh | 257/676 |

* cited by examiner

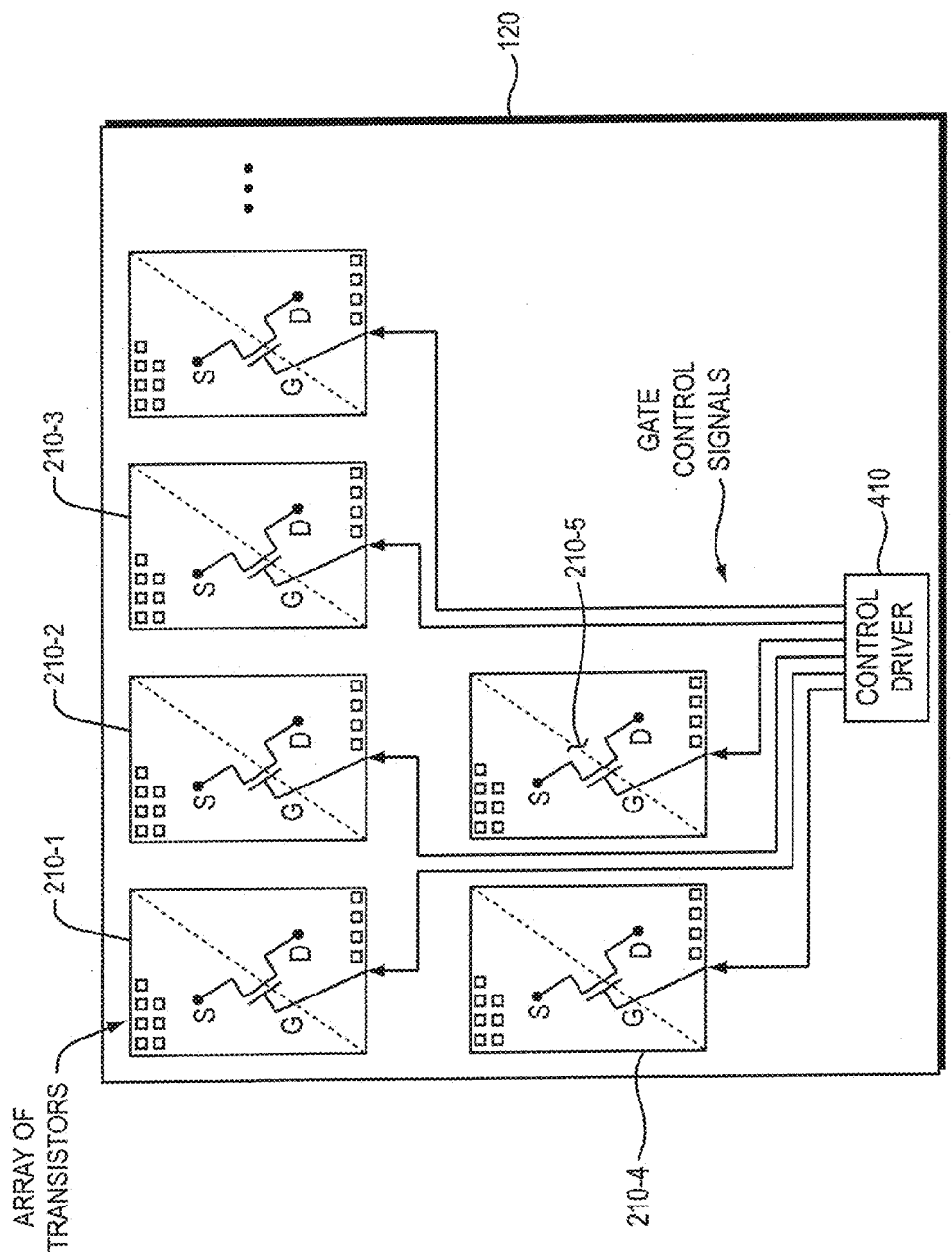

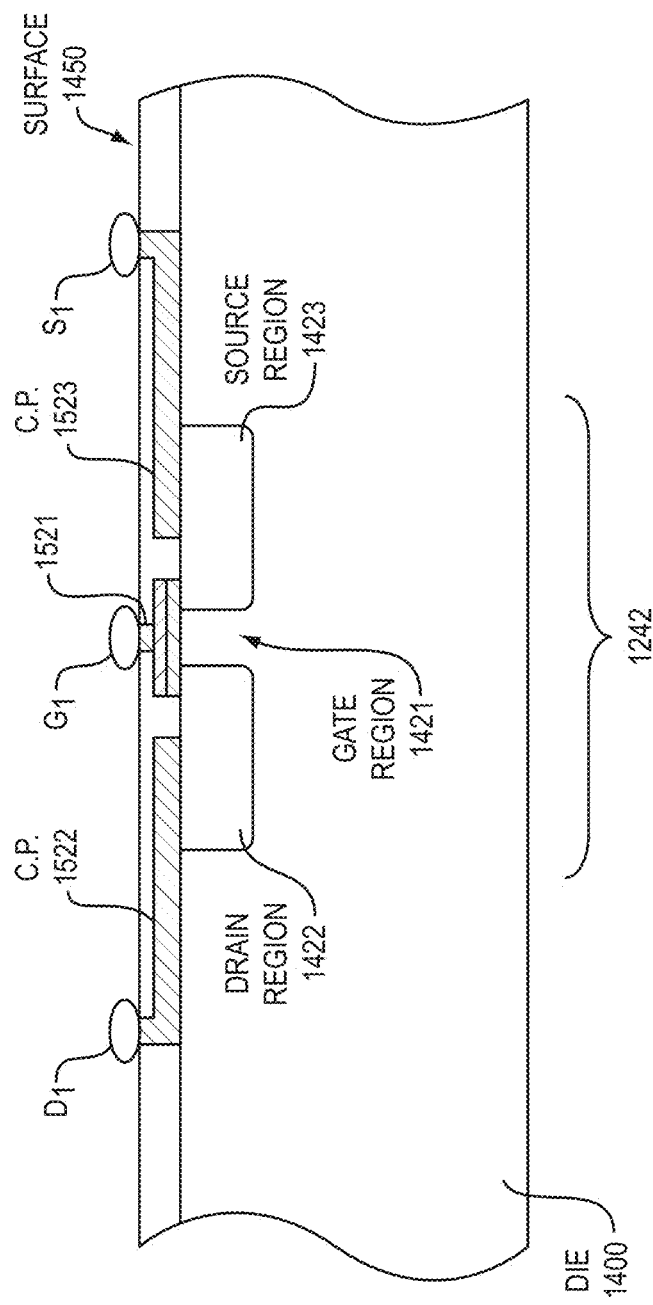

ELECTRICAL CONNECTIVITY OF DIE TO A HOST SUBSTRATE

RELATED APPLICATIONS

This application is a continuation-in-part of earlier filed U.S. patent application Ser. No. 12/505,989 entitled "ELECTRICAL CONNECTIVITY FOR CIRCUIT APPLICATIONS,", filed on Jul. 20, 2009, the entire teachings of which are incorporated herein by this reference.

U.S. patent application Ser. No. 12/505,989 is related to and claims the benefit of earlier filed U.S. Provisional Patent Application Ser. No. 61/148,292 entitled "Modular Buck Power Chip and Connectivity Techniques," filed on Jan. 29, 2009, the entire teachings of which are incorporated herein by this reference.

U.S. patent application Ser. No. 12/505,989 is related to and claims the benefit of earlier filed U.S. Provisional Patent Application Ser. No. 61/166,149 entitled "Electrical Connectivity for Circuit Applications," filed on Apr. 2, 2009, the entire teachings of which are incorporated herein by this reference.

BACKGROUND

Surface-mount technology (SMT) provides a way of interconnecting electronic circuit components with each other. For example, according to such technology, electronic devices are specifically packaged for mounting directly on a respective surface of a printed circuit board. Because of the advantages associated with surface mount technology such as smaller part size, surface mount technology has, to a large extent, replaced through-hole technology in which wire leads of components are fitted and soldered into holes of a printed circuit board to provide connectivity.

Surface mount devices come in a variety of styles. For example, a surface mount device can have relatively small leads or no leads at all. Because a surface mount device has relatively small leads or no leads at all, a surface mount device is usually smaller than its through-hole counterpart. The surface mount device may have short pins or leads of various styles, flat contacts, a matrix of solder balls (such as Ball Grid Arrays), or terminations on the body of the component.

One type of electronic circuit that can be packaged in a surface mount device is an integrated circuit or semiconductor chip. The integrated circuit can provide a variety of functionality depending on how the integrated circuit (e.g., chip) is designed. For example, in a specific application, an integrated circuit can include one or more arrays of small transistors that are interconnected in parallel with respect to each other based solely on metal layers (e.g., conductive paths) in the integrated circuit. Connecting multiple small transistors of an integrated circuit in parallel via the corresponding layers of metal effectively produces a single transistor supporting high current drive and low impedance switching capability.

In certain applications, transistors can be obtained as discrete components and connected in parallel with each other via respective traces on a circuit board. As is the case for multiple transistors connected in parallel via the metal layers in an integrated circuit, the parallel transistors on a circuit board provide higher sinking and sourcing capability.

BRIEF DESCRIPTION

Conventional applications such as those as discussed above can suffer from a number of deficiencies. For example, a conventional switch circuit derived from an array of small transistors in an integrated circuit can require tens, hundreds, or even more transistors connected in parallel via metal in the integrated circuit to produce a single effective, functional transistor. Connecting multiple transistors in parallel can be quite complex due to the number of individual transistors that must be interconnected. For example, each transistor in the array can have a corresponding gate, source, and drain. To connect the transistors in parallel and form a single effective transistor device, the integrated circuit must connect all of the gates to each other, all of the sources to each other, and all of the drains to each other. Providing connectivity requires a complex metal interconnect potentially including many layers.

As is known, the transistors in the device as well as corresponding metal interconnect layers of the integrated circuit are very small and thus difficult and expensive to manufacture. Even if it is possible to manufacture such devices, the complexity of the metal interconnect layers of the integrated circuit means that the device is more likely prone to failure or low manufacture yields. Additionally, when used, the metalization layers in an integrated circuit are usually not thick enough to provide a very low impedance path.

Embodiments herein deviate with respect to the conventional applications as discussed above. For example, embodiments herein are directed to a unique way of providing interconnectivity of circuitry such as transistors in an integrated circuit device.

More specifically, one embodiment herein includes a leadframe comprising a first connection interface. The first connection interface can be configured for attaching an electrical circuit to the leadframe. The leadframe also can include a conductive path. The conductive path in the leadframe provides an electrical connection between a first electrical node of the electrical circuit and a second electrical node of the electrical circuit. Prior to making the connection between the electrical circuit and the leadframe, the first electrical node and the second electrical node are electrically isolated from each other. Subsequent to making connection of the electrical circuit with the leadframe, the conductive path of the leadframe electrically connects the first electrical node and the second electrical node together. Accordingly, embodiments herein include a way of utilizing a leadframe to provide connectivity between nodes of an electrical circuit in lieu of having to provide such connectivity at, for example, an on-chip metal interconnect layer of an integrated circuit device.

The leadframe can also include a second connection interface for attaching the leadframe to a host substrate such as a circuit board. The second connection interface of the leadframe can include one or more contact elements for electrically coupling the conductive path of the leadframe to the substrate.

Although any reasonable configuration is possible, according to one embodiment, the first connection interface resides on a first facing of the leadframe and the second connectivity interface resides on a second facing of the leadframe. The first facing and the second facing of the leadframe can be disposed on opposite sides of the leadframe with respect to each other, adjacent sides of the leadframe, same side of the leadframe, etc.

According to another embodiment, a system includes an electronic circuit device, a circuit board substrate, and a leadframe in which to package the electronic circuit device. The leadframe includes a first facing. The first facing of the leadframe can be configured for attaching the electrical circuit to the leadframe. The leadframe can also include a conductive path. The conductive path in the leadframe provides an electrical connection between a first electrical node of the electronic circuit device and a second electrical node of the electronic circuit device. Prior to being connected to the leadframe, the first electrical node and the second electrical node of the electrical circuit are initially electrically isolated from each other. Subsequent to connecting the electrical circuit to the leadframe, the conductive path in the leadframe provides an electrical connection between the first electrical node and the second electrical node of the electrical circuit.

In one embodiment, the leadframe includes a second facing to complement the first facing. The second facing of the leadframe includes at least one contact element for electrically coupling the conductive path of the leadframe to the circuit board substrate. In such an embodiment, the first electrical node and the second electrical node can be electrically coupled to the circuit board substrate via the conductive paths in the leadframe.

In yet another embodiment, a leadframe device comprises a first facing, a second facing, and a conductive path from the first facing and the second facing. The conductive path has a contact region on the first facing. The conductive path also has a contact region on the second facing. Via coupling of the switch circuits to the contact region on the first facing, the conductive path provides electrical coupling of multiple electrically isolated switch circuits to each other. As mentioned above, via coupling of the substrate to the contact region on the second facing, the conductive path through the leadframe device provides coupling of the multiple switch circuits to a circuit substrate.

In still further embodiments, an integrated circuit device comprises a first switch circuit and a second switch circuit. The first switch circuit includes a first set of switches connected in parallel with each other. The first switch circuit also includes an electrical node for connecting the first switch circuit to a first contact in a leadframe device. The second switch circuit includes a second set of switches connected in parallel with each other. The second switch circuit also includes an electrical node for connecting the second switch circuit to a second contact of the leadframe device. The electrical node of the first switch circuit is at least initially electrically isolated from the electrical node of the second switch circuit. As described herein, the leadframe device can include a conductive path for electrically coupling the first contact and the second contact. More specifically, a connection of the electrical node in the first switch circuit to the first contact of the leadframe device and a connection of the electrical node in the second switch circuit to the second contact of the leadframe device electrically couples the electrical node in the first switch circuit to the electrical node in the second switch circuit.

Embodiments herein further include methods of using a leadframe to provide connectivity. For example, one embodiment herein includes receiving an integrated circuit and a leadframe device in which to package the integrated circuit. The integrated circuit such as a semiconductor device or semiconductor chip has multiple electrically isolated switch circuits or switch circuit nodes disposed thereon. In such an embodiment, electrical coupling of the integrated circuit to a facing of the leadframe device provides connectivity between the multiple electrically isolated switch circuits or switch circuit nodes via at least one conductive path in the leadframe device.

Yet further embodiments include an apparatus. The apparatus includes a die. The die comprises: a first transistor and a second transistor. A surface of the die includes multiple conductive elements disposed thereon. The multiple conductive elements on the surface of the die are electrically coupled to respective nodes of the first transistor and the second transistor. In one embodiment, the apparatus further includes a host substrate. The surface of the die including the respective conductive elements is mounted on a facing of the host substrate. Accordingly, a die including multiple transistors can be flipped and mounted onto a respective host substrate such as printed circuit board, lead frame, etc.

This example embodiment can be implemented along with any of one or more of the following features to produce yet further embodiments below:

For example, in one embodiment, the surface of the die is mounted directly on the host substrate.

In accordance with another embodiment, the surface of the die is directly coupled to an electronic circuit package. The electronic circuit package can be mounted to the host substrate. The electronic circuit package provides connectivity between the respective nodes and the facing of the host substrate.

In still further embodiments, the first transistor is electrically isolated from the second transistor prior to mounting of the die to the facing of the host substrate. At least one conductive path disposed on the host substrate provides electrical connectivity between the first transistor and the second transistor.

The first transistor can be configured to include a gate node, a source node, and a drain node. The second transistor also can be configured to include a gate node, a source node, and a drain node.

In yet further embodiments, the first transistor can be a control switch of a switching power supply circuitry. The second transistor can be a synchronous switch in the switching power supply circuitry. In one embodiment, the host substrate provides an electrical connection between the source node of the first transistor and the drain node of the second transistor.

In accordance with further embodiments, the apparatus can include an inductor element. The first node of the inductor element can be electrically connected to the source node of the first transistor and the drain node of the second transistor. The apparatus can further include a controller. The controller can be configured to receive feedback of an output voltage produced at a second node of the inductor. In one embodiment, the controller drives the gate node of the first transistor and the gate node of the second transistor to produce the output voltage within a desired range.

In yet further embodiments, the host substrate electrically connects an input voltage to the source node of the first transistor.

In another embodiment, the first transistor is electrically coupled to the second transistor via a conductive path disposed in the die.

The die can be configured to include a controller, nodes of the controller electrically coupled to conductive paths on the host substrate. The controller can be configured to control operational states of the first transistor and the second transistor via control signals transmitted over the conductive paths.

In yet further embodiments, the first transistor is a first single lateral field effect transistor disposed in the die. The second transistor is a second single lateral field effect transistor disposed in the die.

Yet additional further embodiments include a method. The method includes: receiving a die and mounting a surface of the die to a facing of a host substrate. The die can be configured to include a first transistor and a second transistor. The surface of the die includes multiple conductive elements thereon. Subsequent to mounting, the multiple conductive elements on the surface can be electrically coupled to respective nodes of the first transistor and the second transistor.

This example method embodiment can be implemented along with any of one or more of the following features to produce yet further embodiments below:

For example, in one embodiment, the method further comprises mounting the surface of the die directly onto the host substrate.

In yet further embodiments, the surface of the die can be directly coupled to an electronic circuit package. The method embodiments can further include: mounting the electronic circuit package to the host substrate. In such an instance, the host substrate provides connectivity between the respective nodes and the facing of the host substrate.

In another embodiment, the first transistor is electrically isolated from the second transistor prior to mounting of the die to the facing of the host substrate. The method can further include: mounting the die to the facing of the host substrate to provide electrical connectivity between the first transistor and the second transistor via at least one conductive path disposed on the host substrate.

In yet a further method embodiment, the first transistor is a control switch of a switching power supply circuit. The second transistor is a synchronous switch in the switching power supply circuitry. The method further comprises: via a first conductive path in the host substrate, providing an electrical connection between a source node of the first transistor and the drain node of the second transistor; and via a second conductive path in the host substrate, electrically connecting an input voltage to a source node of the first transistor.

In accordance with another embodiment, the method can include electrically connecting both the source node of the first transistor and the drain node of the second transistor to a first node of an inductor element; and electrically connecting a controller to a gate node of the first transistor and a gate node of the second transistor. The controller can be configured to produce an output voltage at a second node of the inductor to be within a desired range.

In still further embodiments, the die can include a controller circuit. The method further comprises: via conductive paths in the host substrate, electrically coupling the respective nodes of the die to the controller. The controller can be configured to control operational states of the first transistor and the second transistor via control signals transmitted over the conductive paths.

These and other more specific embodiments are disclosed in more detail below.

The embodiments as described herein are advantageous over conventional techniques. For example, the leadframe device according to embodiments herein can provide unique connectivity, alleviating the complexity of having to provide connections at a metal interface of an integrated circuit device.

It is to be understood that the system, method, apparatus, etc., as discussed herein can be embodied strictly as hardware, as a hybrid of software and hardware, or as software alone such as within a processor, or within an operating system or a within a software application. Example embodiments of the invention may be implemented within products and/or software applications such as those developed or manufactured by CHiL Semiconductor of Tewksbury, Mass., USA.

As discussed above, techniques herein are well suited for use in leadframe packaging applications. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

For example, as further discussed below, embodiments herein support: 1) scalability by adding or deleting rows and columns of transistor array module to produce larger and smaller circuit devices 2) use of conductive paths in a leadframe device to provide current path interconnects between transistor modules to enable the use of thick top layer metal (in parallel with other layers of a semiconductor device) for control purposes, a low impedance gate interconnect as described herein enables a centralized driver circuit which simplifies a leadframe design, further enhancing scalability; and 3) size matching of chip transistor modules with respect to a leadframe strip pitch in a leadframe device.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FIG. 4A is an example diagram of an electrical circuit of multiple electrically individual tiles of transistors according to embodiments herein.

FIG. 15A is an example diagram illustrating a side view of a die according to embodiments herein.

DETAILED DESCRIPTION

Figure 1:
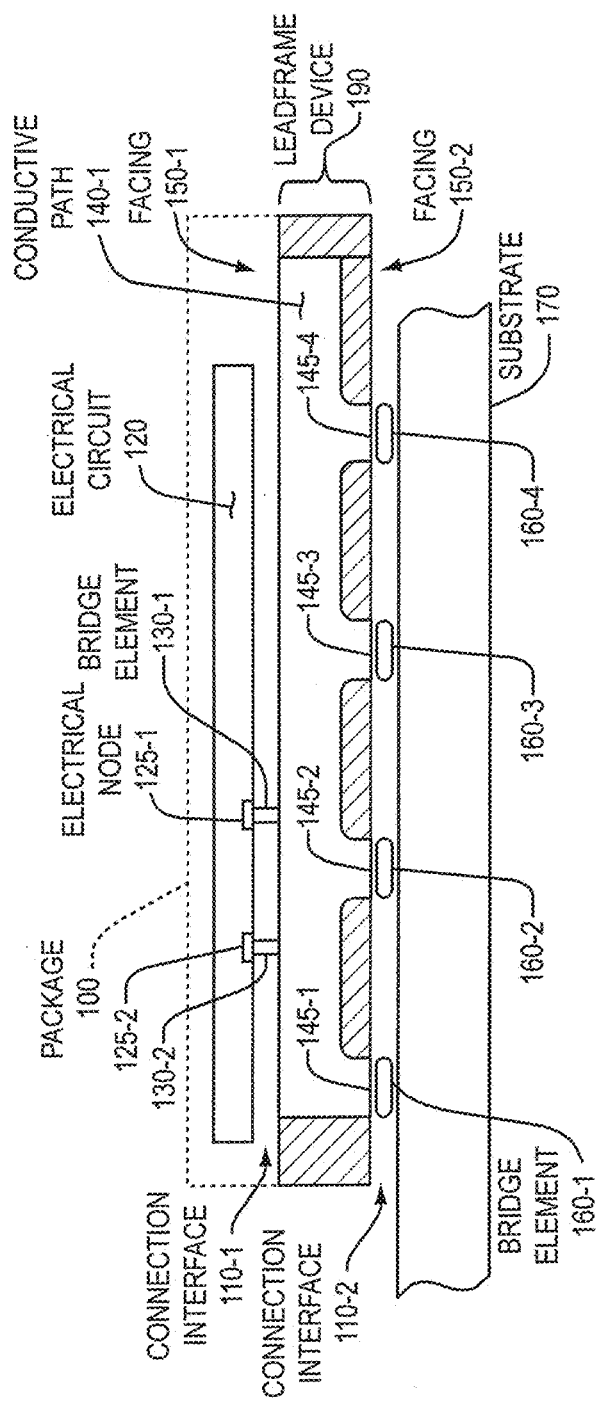
FIG. 1 is an example side view diagram of a leadframe package according to embodiments herein.

FIG. 1 is an example diagram illustrating interconnectivity of an electrical circuit 120, leadframe device 190, and substrate 170 according to embodiments herein.

As shown, one embodiment herein includes a leadframe device 190 comprising a connection interface 110-1. The connection interface 110-1 can be configured for electrically attaching an electrical circuit 120 to the leadframe device 190.

The leadframe device 190 includes a conductive path 140-1. The conductive path 140-1 has a contact region on facing 150-1 in the leadframe device 190 and provides an electrical connection between electrical node 125-1 of the electrical circuit 120 and electrical node 125-2 of the electrical circuit 120.

Prior to making the connection between the electrical circuit 120 and the contact region of the conductive path 140 in the leadframe device 190, the electrical node 125-2 and the electrical node 125-1 are electrically isolated from each other. In other words, they are not electrically connected with respect to each other by virtue of a metal interconnect on the electrical circuit 120.

Subsequent to making connection of the electrical circuit 120 with the leadframe device 190 via conductive bridge elements 130, the conductive path 140-1 of the leadframe device 190 electrically connects the electrical node 125-2 and the electrical node 125-1 together.

In one embodiment, the conductive bridge element 130-1 electrically connects the electrical node 125-1 to the conductive path 140-1. The conductive bridge element 130-2 electrically connects the electrical node 125-2 to the conductive path 140-1.

The conductive bridge element 130 can take on any of a number of different forms. For example, in one embodiment, the conductive bridge element 130 is a pillar made of conductive material.

The pillar or other suitably shaped bridge can be formed on a surface of the electrical circuit 120 by depositing a metal layer on the electrical circuit 120 and then etching away a portion of the deposited metal layer to produce, for example, one or more pillars. In one embodiment, the pillars are plated up after a mask is applied. This is a selective plating process as opposed to a selective etching. Either approach could be used.

A conductive material such as solder can be used to connect the pillar (conductive bridge element) to the conductive path 140-2. In one embodiment, the conductive bridge elements 130 are made from copper, although any suitable metal can be used to provide such functionality.

Thus, in an example embodiment, the electrical node 125-1 can be electrically coupled to a pillar of conductive material for connecting a first portion of the electrical circuit 120 to the conductive path 140-1 of the leadframe device 190. The electrical node 125-2 can be electrically connected to a second pillar of conductive material for connecting a second portion of the electrical circuit 120 to the conductive path 140-1 of the leadframe device 190. Again, the conductive bridge elements 130 can be made of copper or other suitable material.

According to other alternative embodiments, note that the conductive bridge elements 130 can be solder balls that connect respective electrical nodes 125 of the electrical circuit 120 to the conductive path 140-1. As mentioned, any suitable conductive material can be used to provide connectivity between the electrical nodes 125 and the conductive path 140-1.

Note that in an example embodiment the electrical circuit 120 is an integrated circuit such as a semiconductor chip. The electrical nodes 125 can emanate from a single electrical circuit 120 fabricated on a common semiconductor substrate. The electrical circuit 120 can thus be a semiconductor chip cut from a wafer.

In alternative embodiments, the electrical circuit 120 can include a number of semiconductor chips that are packaged into the same leadframe package 100.

Accordingly, embodiments herein include a way of utilizing a leadframe device 190 to provide off-chip connectivity between electrical nodes 125 of an electrical circuit 120 in lieu of having to provide such connectivity at, for example, a metal interconnect layer of the integrated circuit device.

As shown, the leadframe device 190 can also include a second connection interface 110-1 for attaching the leadframe device 190 to a substrate 170 such as a printed circuit board, flex-board, etc. Conductive bridge elements 160 such as conductive bridge element 160-1, conductive bridge element 160-2, conductive bridge element 160-3, and conductive bridge element 160-4 can provide electrical connectivity between the contact elements 145 and a respective one or more traces of the substrate 170. In one embodiment, each of the contact elements 145 is a conductive surface pad of the leadframe device 190 that is electrically attached to the substrate 170 via a conductive bridge element 160 such as solder.

The second connection interface 110-2 of the leadframe device 190 can include one or more contact elements 145 (e.g., contact element 145-1, contact element 145-2, contact element 145-3, contact element 145-4) for electrically coupling the conductive path 190 of the leadframe device 190 to the substrate 170. In other words, according to one embodiment, the conductive path 140-1 can include multiple contact elements 145 for electrically connecting the conductive path 140-1 to the substrate 170.

As shown, the contact elements 145 can be separated from each other via electrically non-conductive material such as a plastic filler of the leadframe package 100. The cross-hatched region indicates non-conductive material between the contact elements 145.

Although any reasonable configuration is possible, according to one embodiment, the first connection interface 110-1 resides on a first facing 150-1 of the leadframe device 190 and the second connectivity interface 110-2 resides on a second facing 150-2 of the leadframe device 190.

By way of a non-limiting example, the first facing 150-1 and the second facing 150-2 of the leadframe device 190 can be disposed on opposite sides of the leadframe device 190 with respect to each other, adjacent sides of the leadframe, same side of the leadframe, etc.

One way to produce the leadframe device 190 is to start out with a slab of metal such as copper of appropriate thickness. The copper can be etched or machined to remove metal between the conductive paths 140 so that each of the conductive paths 140 are electrically independent of each other. In other words, according to one embodiment, the conductive paths 140 in leadframe device 190 are not connected to each other.

Further machining can be performed at axial ends of the conductive paths 145 to fit the conductive paths 140 within the leadframe device 190. Since it may be desirable to have spaced surfaces as in FIG. 8, portions of each of one or more of the conductive paths 140 on facing 150-2 can be etched and filled in with a non-conductive material such as plastic so that pads or contact elements are spaced from each other. The non-conductive material such as plastic also can fill in between the conductive paths 140 and above and around circuit 120 so as to produce package 100 and protect the electrical circuit from adverse environmental conditions.

Note that the inclusion of contact elements 145 on each of one or more of the conductive paths 140 is shown by way of non-limiting example only and that a respective conductive path need include a surface in which to attach to a host substrate 170. Accordingly, the respective conductive path can be used as a way of connecting nodes of electrical circuit 120 at a layer other than in a metalization layer of an integrated circuit. In this latter embodiment, when the leadframe device 190 is attached to a host substrate 170, the respective conductive path does not attach to the substrate.

Figure 2:
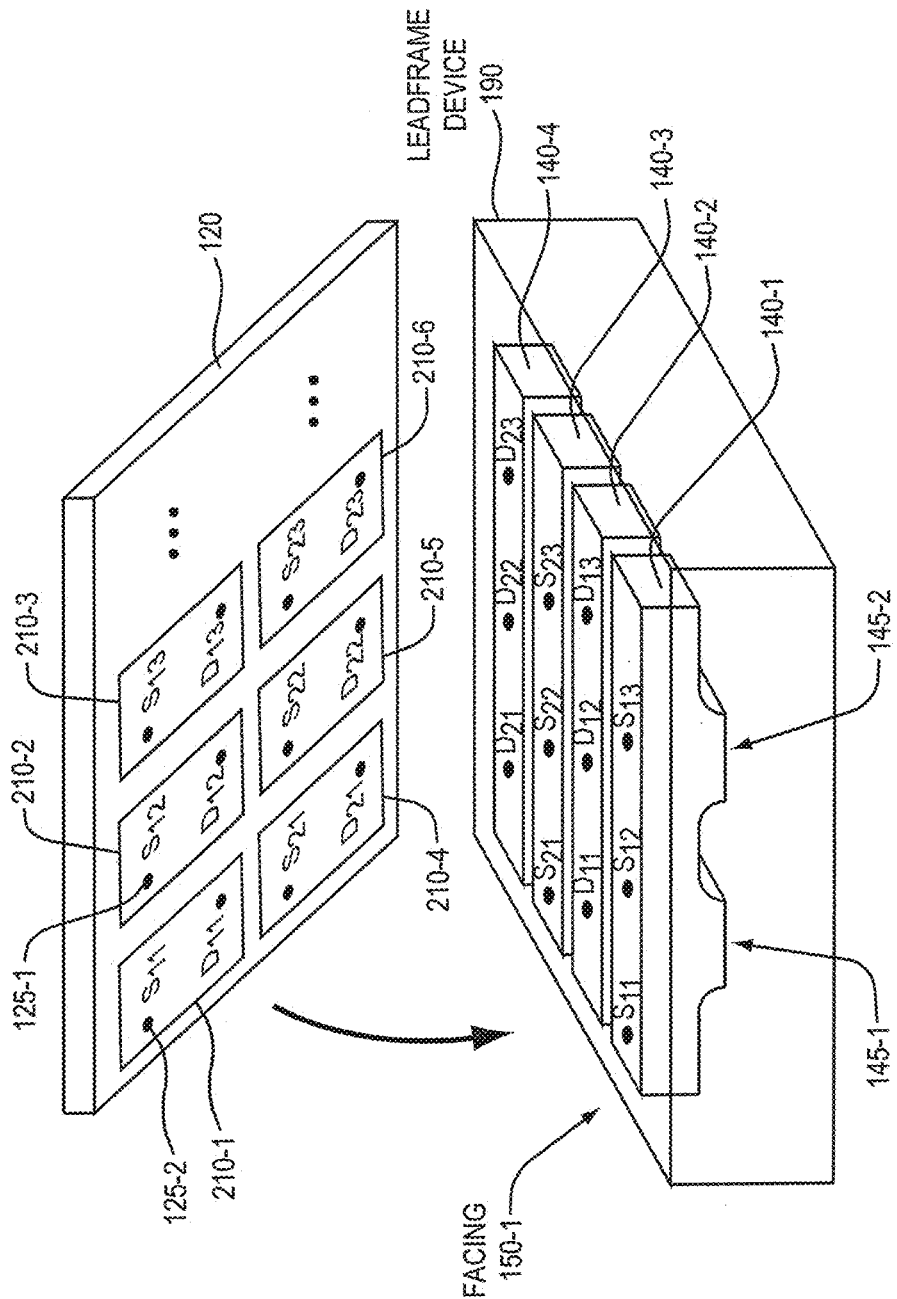
FIG. 2 is an example 3-D diagram illustrating coupling of an electrical circuit to a corresponding leadframe according to embodiments herein.

FIG. 2 is an example 3-D diagram illustrating how an electrical circuit 120 is coupled to a leadframe device 190 according to embodiments herein.

As shown, the exposed side of electrical circuit 120 having electrical nodes 125 (e.g., electrical node 125-1, electrical node 125-2, etc.) is attached to the facing 150-1 of the leadframe device 190.

In one embodiment, the electrical circuit 120 is a planar-shaped device (such as an integrated circuit, semiconductor device, etc.) including multiple circuits 210 (e.g., circuit 210-1, circuit 210-2, circuit 210-3, circuit 210-4, circuit 210-5, circuit 210-6) spread about a surface of the electrical circuit 120 (e.g., planar shaped device).

A size associated with leadframe device 190 and corresponding electrical circuit 120 is highly scalable. For example, a number of rows and/or columns of circuits 210 residing on electrical circuit 120 can be varied to create switches having different sinking/sourcing capabilities. In such embodiments when the row and/or columns of circuits 210 is adjusted, the size of leadframe device 190 and number of conductive paths 140 in the leadframe device 190 can be adjusted to match the number of rows and columns of circuits 210 of electrical circuit 120. An example of adjusting rows and columns circuits 210 is shown and discussed with respect to FIG. 4B.

Referring again to FIG. 2, each of the electrical circuits 210 of circuit 120 can have one or more inputs and/or one or more outputs that are electrically independent of each other. For example, in one embodiment, electrical circuit 120 is an array of switch tiles (circuits 210), each of which has a respective source and drain that are not attached to sources and drains of any of the other electrical circuits 210. In other words, the respective source nodes and drain nodes can be electrically isolated from each other except for the electrical connection provided by the conductive path in the leadframe device 190. In one embodiment, each of the conductive paths 140 is electrically independent until the leadframe device 190 is electrically attached to a circuit board substrate. As discussed later in this specification, the circuit substrate (to which the leadframe device 190 is attached) can include further conductive paths that provide connectivity amongst the conductive paths 140 in the leadframe device 190.

In one embodiment, each of the circuits 210 is a switch circuit as will be discussed later in this specification. Connectivity of the circuits 210 with respect to the conductive paths 140 as described herein connects the circuits 210 in parallel. As mentioned, contact elements of the conductive paths (e.g., surfaces on facing 150-2 of leadframe device 190 provide connectivity with respect to a substrate such as a printed circuit board or other interconnecting device.

The conductive paths 140 (e.g., conductive path 140-1, conductive path 140-2, conductive path 140-3, conductive path 140-4, etc.) can provide connectivity between the multiple electrically independent circuits 210 and, optionally, through the leadframe device 190 to the substrate 170. For example, as shown, the facing of electrical circuit 120 can be pressed or moved into communication of the facing 150-1 of the leadframe device 190 to connect the electrical nodes 125 to corresponding locations on the conductive paths 140.

More specifically, when electrical circuit 120 is moved into communication with facing 150-1, electrical node 125-2 (e.g., source node $S_{11}$) of circuit 210-1 comes in contact with the location labeled $S_{11}$ on conductive path 140-1; electrical node 125-1 (e.g., source node $S_{12}$) of circuit 210-2 comes in contact with the location labeled $S_{12}$ on conductive path 140-1; electrical node labeled source node $S_{13}$ in circuit 210-3 comes in contact with the location labeled $S_{13}$ on conductive path 140-1; and so on. Thus, the conductive path 140-1 of leadframe device 190 can provide "off-chip" connectivity with respect to a first set of electrical nodes in the electrical circuit 120.

In accordance with the above embodiment, when electrical circuit 120 is moved in communication with facing 150-1, electrical node labeled drain node $D_{11}$ of circuit 210-1 comes in contact with the location labeled $D_{11}$ on conductive path 140-2; electrical node labeled drain node $D_{12}$ of circuit 210-2 comes in contact with the location labeled $D_{12}$ on conductive path 140-2; electrical node labeled drain node $D_{13}$ in circuit 210-3 comes in contact with the location labeled $D_{13}$ on conductive path 140-1; and so on. Thus, the conductive path 140-2 of leadframe device 190 can be configured to provide off-chip connectivity with respect to a second set of electrical nodes in the electrical circuit 120.

Additionally, when electrical circuit 120 is moved in communication with facing 150-1, electrical node labeled source node $S_{21}$) of circuit 210-4 comes in contact with the location labeled $S_{21}$ on conductive path 140-3; electrical node labeled source node $S_{22}$ in circuit 210-5 comes in contact with the location labeled $S_{22}$ on conductive path 140-3; electrical node labeled source node $S_{23}$ in circuit 210-6 comes in contact with the location labeled $S_{23}$ on conductive path 140-3; and so on. Thus, the conductive path 140-3 of leadframe device 190 can provide "off-chip" connectivity with respect to a third set of electrical nodes in the electrical circuit 120.

Additionally, when electrical circuit 120 is seated onto facing 150-1, electrical node labeled drain node $D_{21}$ of circuit 210-4 comes in contact with the location labeled $D_{21}$ on conductive path 140-4; electrical node labeled drain node $D_{22}$ of circuit 210-5 comes in contact with the location labeled $D_{22}$ on conductive path 140-4; electrical node labeled drain node $D_{23}$ in circuit 210-6 comes in contact with the location labeled $D_{23}$ on conductive path 140-4; and so on. Thus, the conductive path 140-4 of leadframe device 190 can be configured to provide off-chip connectivity with respect to a fourth set of electrical nodes in the electrical circuit 120.

In further embodiments, it can be seen that at least a portion of each respective conductive path 140 in the leadframe device 190 can be substantially orthogonal with respect to a plane of the planar-shaped device (e.g., electrical circuit 120) on which the multiple circuits 210 reside.

Figure 3:
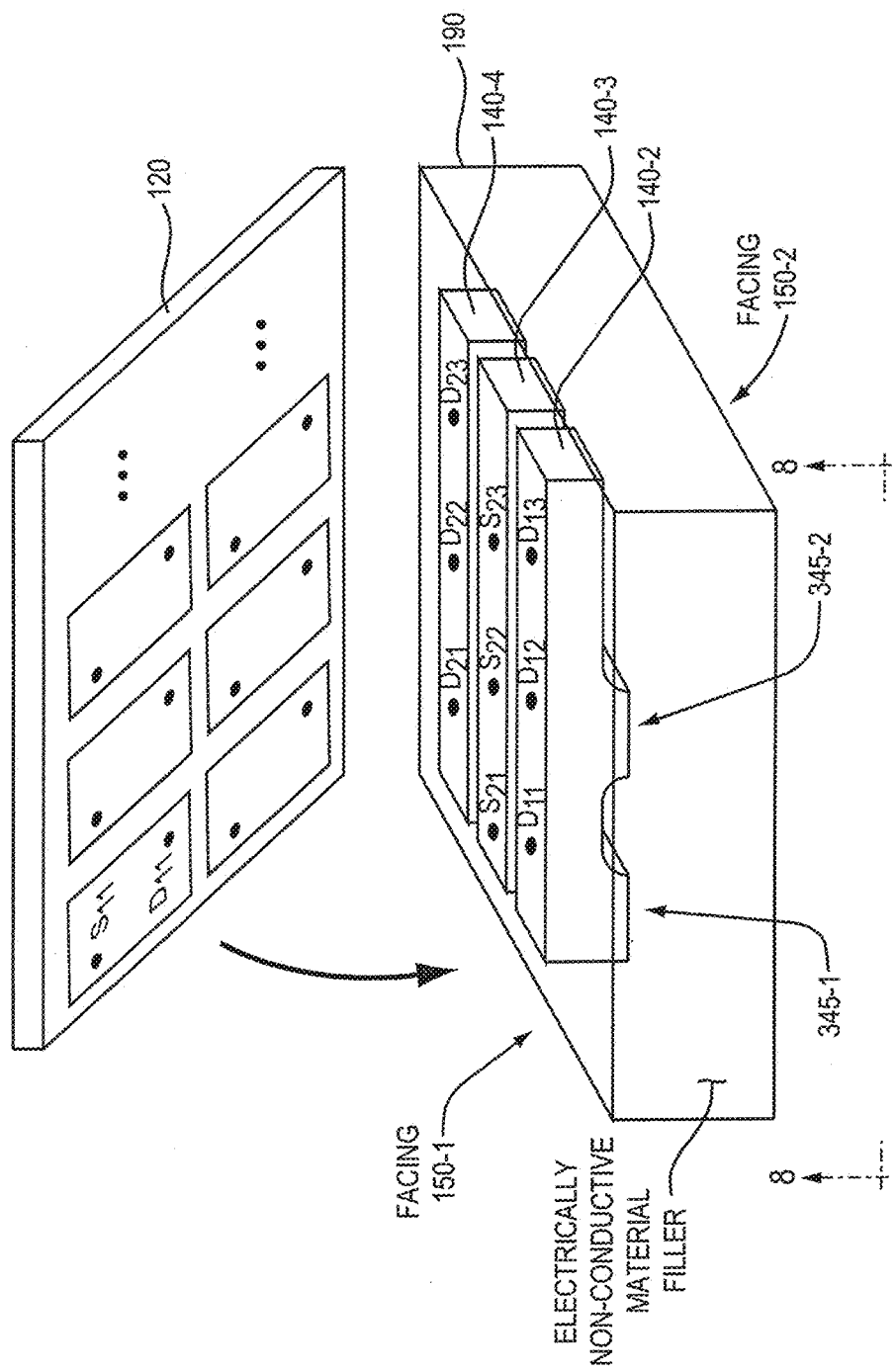
FIG. 3 is an example 3-D diagram illustrating coupling of an electrical circuit to a corresponding leadframe according to embodiments herein.

FIG. 3 is an example 3-D diagram illustrating how an electrical circuit 120 is coupled to a leadframe device 190 according to embodiments herein. In this example figure, the conductive path 140-1 has been removed for easier viewing of conductive path 140-2 and corresponding contact elements 345 (e.g., contact element 345-1 and contact element 345-2). As shown, the contact elements 345 of the conductive path 140-2 are offset with respect to the contact elements 145 of conductive path 140-1. More details of the offset and pad configuration of facing 150-2 are shown and discussed with respect to FIG. 8 below.

FIG. 4A is a diagram illustrating example functionality of the circuits 210 residing on electrical circuit 120 according to embodiments herein. As shown, each circuit 210-1 can provide functionality such as a switch device.

In one embodiment, each circuit 210 includes a respective array of field effect transistors in an integrated circuit that are connected in parallel to each other of to form a switch circuit tile (e.g., circuit 210). As previously discussed, the switch circuit tiles each can include two electrical nodes (e.g., a source node and drain node) that connect to respective conductive paths 140. The common gates of circuit 210 can connect to control driver 410.

For example, electrical circuit 120 can include a control driver 410. In one embodiment, the control driver 410 produces a set of gate control signals that are used to drive the gates of each respective circuit 210. In a further example embodiment, the gate control signals are formed in one or more metalization layer of a semiconductor device on which the respective switch tiles are formed. The electrical circuit 120 can include metalization to provide connectivity amongst the transistors within an array in the tile.

Figure 4B:
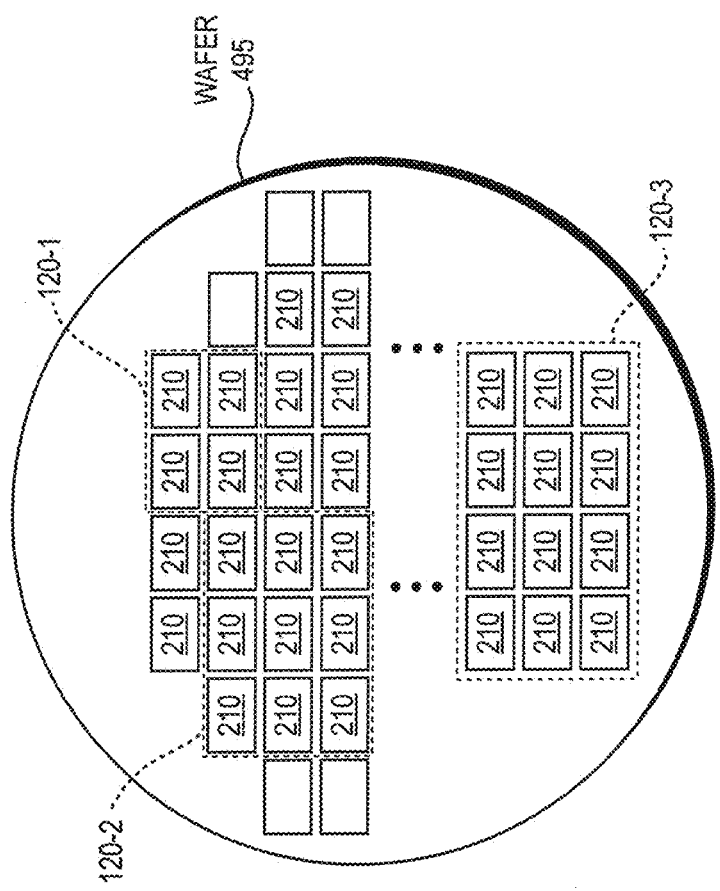
FIG. 4B is an example diagram of electrical circuits on a wafer according to embodiments herein.

FIG. 4B is an example diagram illustrating an example (silicon) wafer 495 having circuits 210 according to embodiments herein. Note that inclusion of a control driver 410 is shown by way of non-limiting example only. The electrical circuit 120 may or may not include circuit 410 or other circuits.

Embodiments herein can include fabricating multiple circuits 210 on a respective wafer 495 such as that shown in FIG. 4B. The wafer 495 can be cut (e.g., sliced and diced) depending on how many of the switch circuits 210 are desired on a respective chip being packaged in the leadframe device 190. For example, the wafer 495 can be cut to produce an electrical circuit 120-1 that has nine circuits 210. The wafer 495 can be cut to produce an electrical circuit 120-2 that has nine circuits 210. The wafer 495 can be cut to produce an electrical circuit 120-3 that has twelve circuits 210. As previously discussed, portions or all of the electrical nodes in each circuit can be independent of the nodes on the other circuits.

Of course, the leadframe device can vary in size and shape as well to accommodate the different sized circuits 120. For applications requiring more robust switching functionality, the package also can be adjusted in size to accommodate larger or smaller electrical circuits 120. Conversely, for applications requiring less robust switching functionality, the package can be larger to accommodate larger electrical circuits 120. As previously discussed, the leadframe device 190 is highly modular and scalable based on sizing and/or spacing of: conductive paths 140, circuits 210, circuit 120, source connections and drain connections on circuits 210, etc. In one embodiment, the sizing includes adding/deleting rows and/or columns of a standard size of circuits 210 (e.g., a field effect transistor array) to produce a family of devices having different capabilities.

Figure 5:
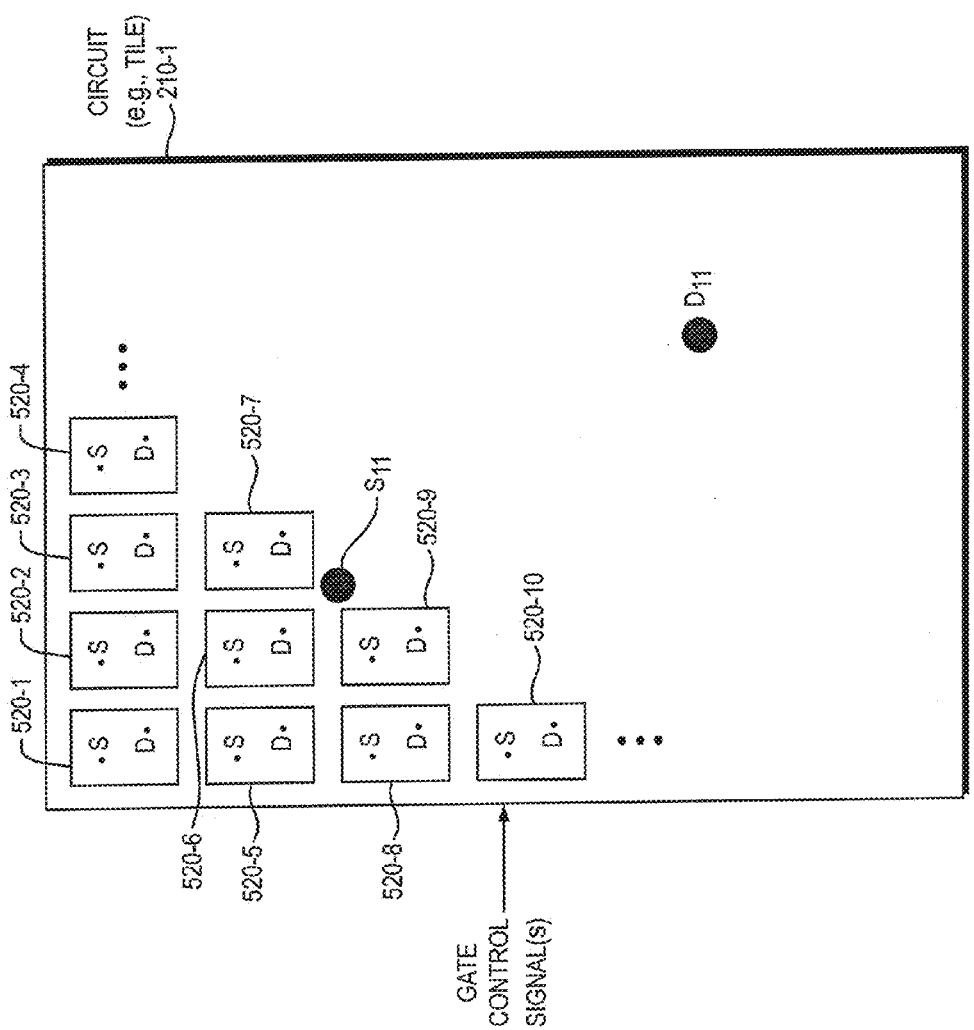
FIG. 5 is an example diagram of a tile including an array of multiple interconnected transistors according to embodiments herein.

FIG. 5 is an example diagram illustrating an electrical circuit 210-1 according to embodiments herein. Note that each of multiple electrical circuits 210 of circuit 120 can be configured in a similar manner as circuit 210-1.

As shown, the example electrical circuit 210-1 can include an array of transistors 520 such as field effect transistors. The array of transistors 520 can include transistor 520-1, transistor 520-2, transistor 520-3, transistor 520-4, transistor 520-5, transistor 520-6, transistor 520-7, transistor 520-8, transistor 520-9, transistor 520-10, etc.

As mentioned above, the electrical circuit 210 can be one of multiple circuits on a respective single integrated circuit substrate. Via metalization in the integrated circuit, the gate nodes, source nodes, and drain nodes of the transistors 520 can be connected to each other.

More specifically, via connectivity such as via metalization in an integrated circuit, the source node of transistor 520-1 can be connected to each of the source nodes of transistor 520-2, 520-3, 520-4, etc.; the source node of transistor 520-2 can be connected to each of the source nodes of transistor 520-1, 520-3, 520-4, etc.; the source node of transistor 520-3 can be connected to each of the source nodes of transistor 520-1, 520-2, 520-4, etc.; and so on.

Via additional connectivity such as metalization in an integrated circuit, the drain node of transistor 520-1 can be connected to each of the drain nodes of transistor 520-2, transistor 520-3, transistor 520-4, etc.; the drain node of transistor 520-2 can be connected to each of the drain nodes of transistor 520-1, transistor 520-3, transistor 520-4, etc.; the drain node of transistor 520-3 can be connected to each of the drain nodes of transistor 520-1, 520-2, 520-4, etc.; and so on. Thus, in one embodiment, the array of transistors 520 can be interconnected to form a single functional transistor circuit having a common source node (e.g., node $S_{11}$) and common drain node (e.g., node $D_{11}$). In such an embodiment, the source node of each transistor 520 can be connected to common node $S_{11}$, the drain node of each transistor 520 can be connected to communication drain node $D_{11}$.

Figure 6:
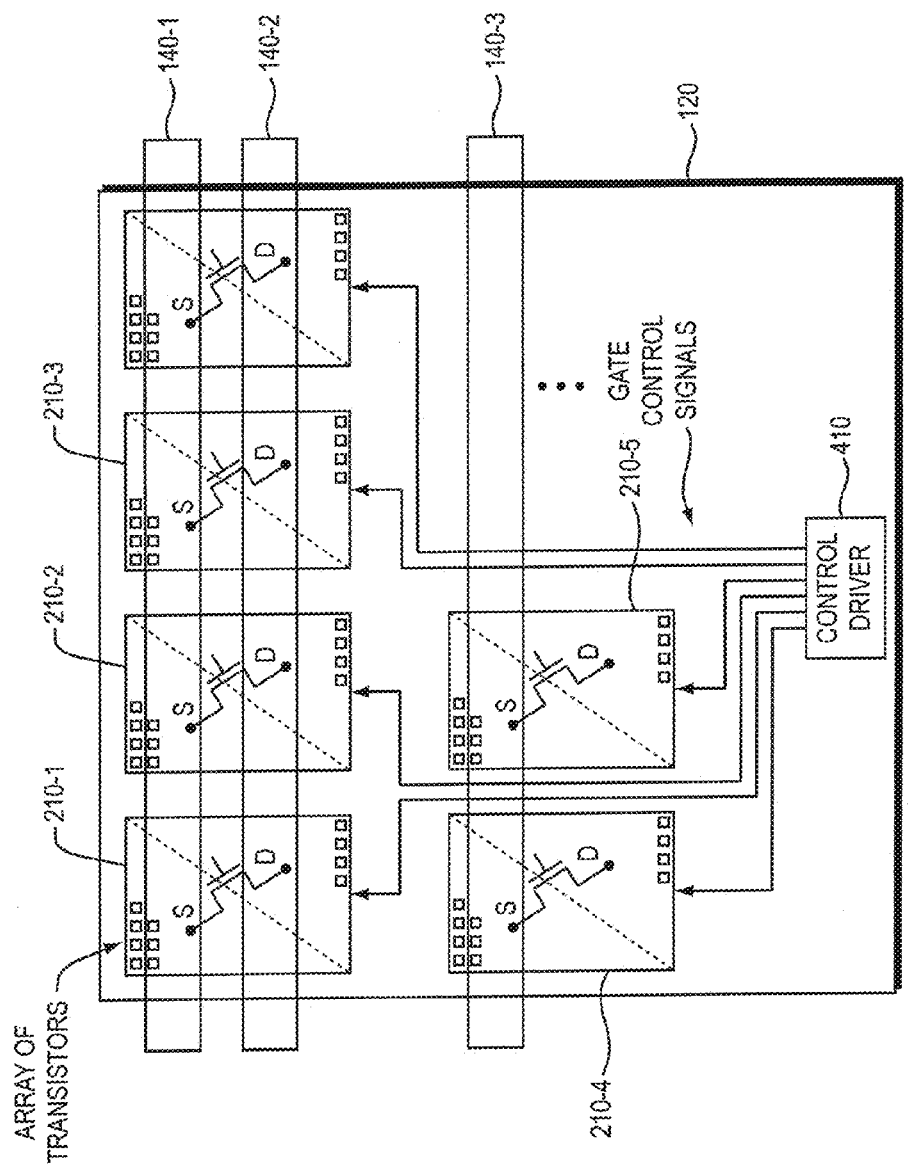
FIG. 6 is an example diagram illustrating connectivity between each transistor tile circuit and a respective conductive path in the leadframe according to embodiments herein.

As previously discussed, each of the common drain node $D_{11}$ and common source node $S_{11}$ are independent of each other and (prior to packaging in leadframe device 190) may be independent of other common source nodes and common drain nodes of other electrical circuits 210. The gate node of each transistor 520 of circuit 210-1 can tie to a common point and be controlled by a common gate signal. As mentioned, the gates can be connected with each other via and interconnect such as metalization in an integrated circuit. FIG. 6 is an example diagram illustrating interconnectivity of tiles (e.g., circuits 210) in parallel via conductive paths 140 in the leadframe device 190 according to embodiments herein. As shown, circuit 210-1 is effectively a large transistor having its common source node connected to conductive path 140-1 and common drain node connected to conductive path 140-2; circuit 210-2 is effectively a large transistor having its common source node connected to conductive path 140-1 and common drain node connected to conductive path 140-2; and so on.

As previously discussed, the metal layer of electrical circuit 120 can include gate control signals from control driver 410 to each of the circuits 210. Creating paths for the gate control signals can be substantially easier according to embodiments herein because the conductive paths 140 in the leadframe device 190 provide connectivity amongst the circuits 210 in lieu of metalization in an integrated circuit. Thus, control signals such as gate control signals or other control signals can be laid out between tiles (e.g., circuits 210) and thus not interfere with the interconnectivity layer disposed over the array of transistors in each circuit 210.

As shown, the spacing and/or widths of conductive paths can be selected depending on a spacing of the respective sources and drains of each circuit 210. For example, the spacing between conductive path 140-1 and conductive path 140-2 depends on locations of sources and drain connections on respective circuits 210-1, 210-2, 210-3, etc. Thus, if each circuit 210 is designed to include a larger sized array (e.g., more rows and/or columns of transistors) or circuit 210, the spacing of the conductive paths 140-1 and conductive path 140-2 can be increased to account for a respective larger spacing between respective sources and drains of circuits 210. Conversely, if the size and/or number of transistors in the circuits 210 is reduced, the respective source connections and drain connections of circuits 210 will be closer together. In this latter case, a spacing and/or widths of conductive paths 140-1 and 140-2 also can be adjusted or reduced to account for the change in size of the circuits 210.

A spacing of the conductive paths 140 can be selected. In such a case, the size of circuits 210 and/or spacing of the sources and drain connections on each circuit 210 can be adjusted to ensure that the source and drain connections of each circuit 210 lines up with a respective conductive path 140 of leadframe device 190. Accordingly, embodiments herein include a highly scalable leadframe device 190.

As discussed herein, FIG. 6 illustrates that the conductive paths 140 provide connectivity between the circuits 210 in lieu of having to provide connectivity in one or more metalization layers of a semiconductor device. Use of the conductive paths 140 in a leadframe device 190 provides unique current path interconnects between circuits 210 (e.g., transistor array modules) to reserve a thick top layer metal in the circuit 120 such as a semiconductor device for routing of gate control signals and/or other control signals between control driver 410 and circuits 210. Accordingly, when circuit 120 is a semiconductor device having multiple tiles or arrays of interconnected transistors, the conductive paths 140 provide a low impedance gate interconnect between tiles while a thick top metal layer of the semiconductor device can be used to provide connectivity between a centralized driver circuit and the multiple tiles. This simplifies a leadframe design and further enhances scalability.

Figure 7:
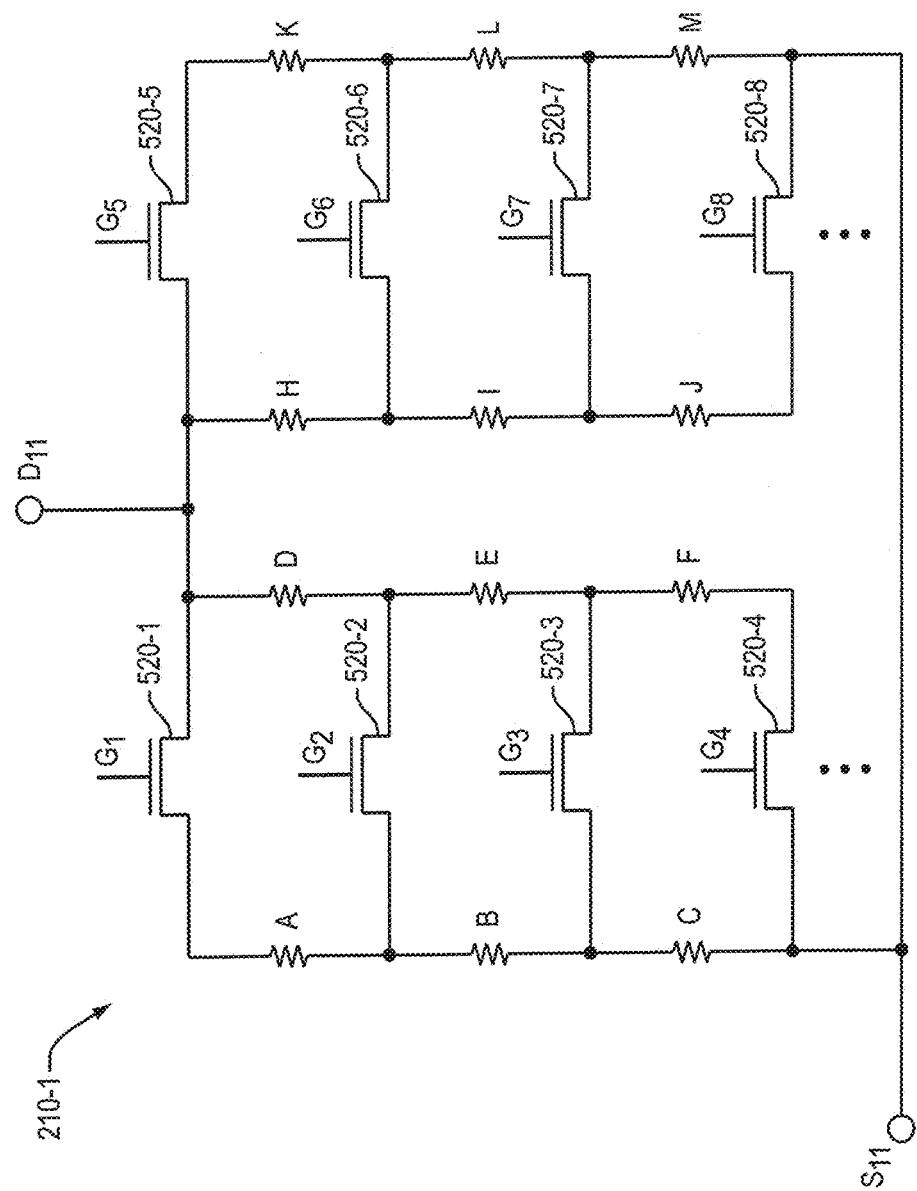
FIG. 7 is an example diagram illustrating an array of interconnected transistors according to embodiments herein.

FIG. 7 is an example diagram illustrating interconnectivity of transistors 520 and hypothetical impedances according to embodiments herein. As previously discussed, the transistors 520 can be interconnected via metalization layers in an integrated circuit. By way of a non-limiting example, the embodiment of FIG. 7 illustrates how the multiple transistors 520 can be interconnected in such a way that the impedance paths for each transistor 520 are reasonably matched with the other transistors 520 in electrical circuit 210-1.

The impedance values A, B, C, D, E, F, G, H, I, J, K, L, M, etc. represent the impedances of conductive links (e.g., metalization layers in an integrated circuit) between each of the transistors 520. The connectivity within the electrical circuit (and each of the other electrical circuits 210) can be configured such that the total impedance path for any transistor is within a tolerance value such as within, for example, 20%. In other words, the legs of the paths can be within a nominal value+/−10 percent.

Assume in the present example that the impedance values A, B, C, D, E, F, G, H, I, J, K, L, M, etc. represent an impedance of approximately 12.5 milliohms each. Note that the value of 12.5 milliohms is shown by way of non-limiting example only. The value may be different depending on the application.

The impedance associated with transistor 520-2 between node $D_{11}$ and node $S_{11}$ includes a sum of impedance D (approximately 12.5 milliohms), impedance B (approximately 12.5 milliohms), and impedance C (approximately 12.5 milliohms). Assume in this example that the impedance between node $D_{11}$ and transistor 520-1 is negligible. Thus, the total impedance path for transistor 520-2 (not including the transistor itself) is approximately 45 milliohms.

In furtherance of this example, the impedance associated with transistor 520-2 between node $D_{11}$ and node $S_{11}$ includes a sum of impedance D (approximately 12.5 milliohms), impedance B (approximately 12.5 milliohms), and impedance C (approximately 12.5 milliohms). Thus, the total impedance path for transistor 520-2 (not including the transistor itself) is approximately 45 milliohms.

The impedance associated with transistor 520-3 between node $D_{11}$ and node $S_{11}$ includes a sum of impedance D (approximately 12.5 milliohms), impedance E (approximately 12.5 milliohms), and impedance C (approximately 12.5 milliohms). Thus, the total impedance path for transistor 520-3 (not including the transistor itself) is approximately 45 milliohms.

The impedance associated with transistor 520-4 between node $D_{11}$ and node $S_{11}$ includes a sum of impedance D (approximately 12.5 milliohms), impedance E (approximately 12.5 milliohms), and impedance F (approximately 12.5 milliohms). Assuming that the impedance between node $S_{11}$ and transistor 520-4 is negligible, the total impedance path for transistor 520-4 (not including the transistor itself) is approximately 45 milliohms.

In a similar manner, the impedance path values for each of transistors 520-5, 520-6, 520-7, 520-8, etc. are each approximately equal to 45 milliohms as well.

Providing balanced path impedance interconnectivity in this manner is useful because the burden of providing isolation/coupling is more equally shared amongst the transistors 520. Thus, no single one of group of transistors is unduly stressed under high current sinking or sourcing conditions.

Figure 8:
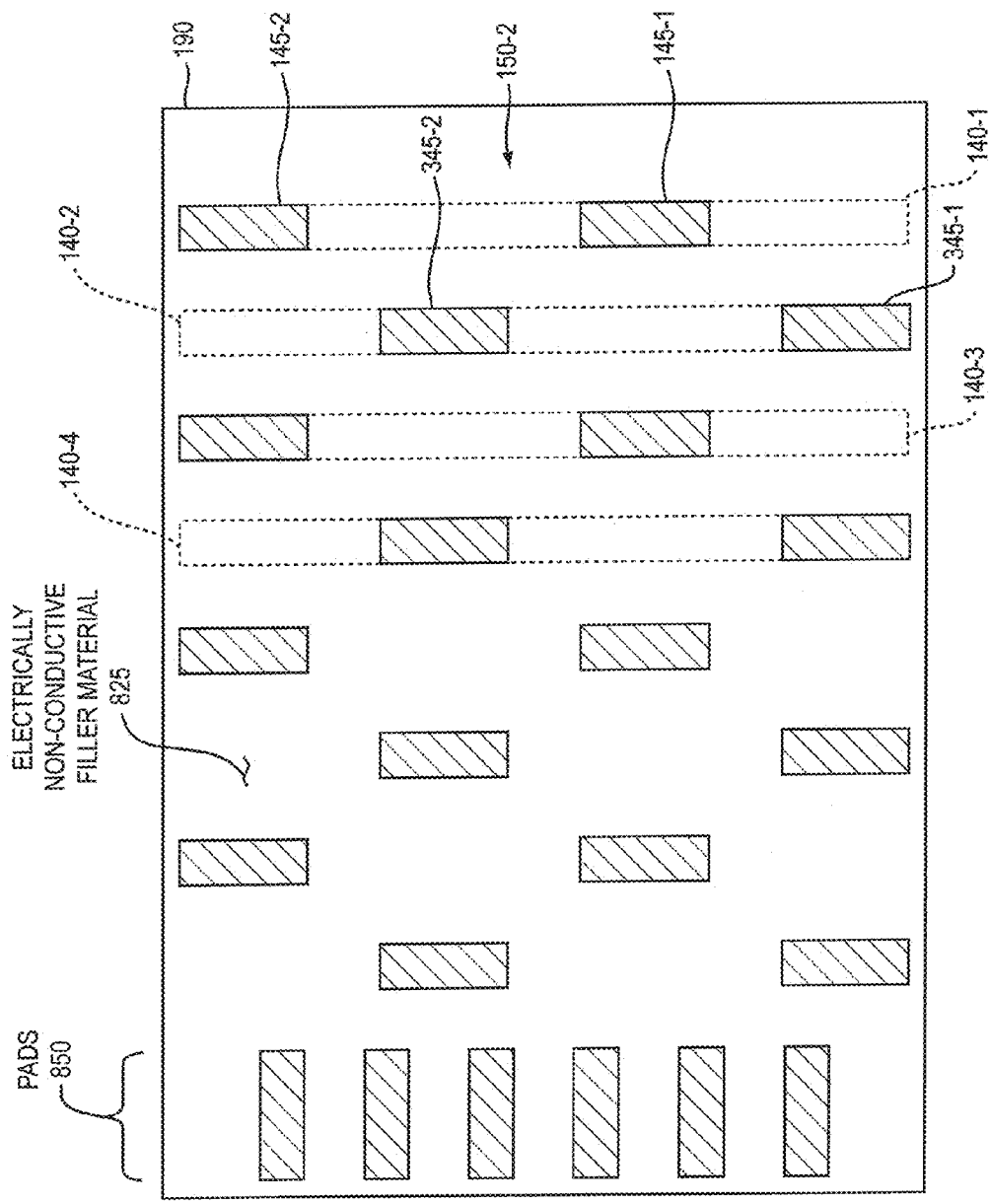
FIG. 8 is an example diagram of a footprint associated with a leadframe package according to embodiments herein.

FIG. 8 is an example diagram illustrating a footprint and corresponding surface pads of leadframe device 190 for connecting to a circuit board substrate according to embodiments herein.

According to this example embodiment, only portions of the conductive paths 140 are exposed on a respective surface of the leadframe device 190. For example, contact element 145-1 and contact element 145-2 (rather than a whole length of the conductive path 140-1) are exposed on a bottom surface of the leadframe device 190 for attaching to a host such as printed circuit board; contact element 345-1 and contact element 345-2 (rather than a whole length of the conductive path 140-2) are exposed on a bottom surface of the leadframe device 190 for attaching to a host such as printed circuit board; and so on.

The checkerboard like pattern of connection interface 150-2 reduces the likelihood, during mounting of the leadframe device 190 to a host, such as a printed circuit board, that a stray piece of wire, solder, conductive matter, etc. will accidentally form between the effective pads (e.g., contact elements) of the leadframe device 190.

Note that additional pads 850 and corresponding conductive paths of the leadframe device 190 can provide connectivity with respect to the additional circuitry of the electrical circuit 120. For example, the pads 850 can provide conductive pathways form a printed circuit board on which the leadframe device 190 resides and gate driver or related circuitry of electrical circuit 120.

Figure 9:
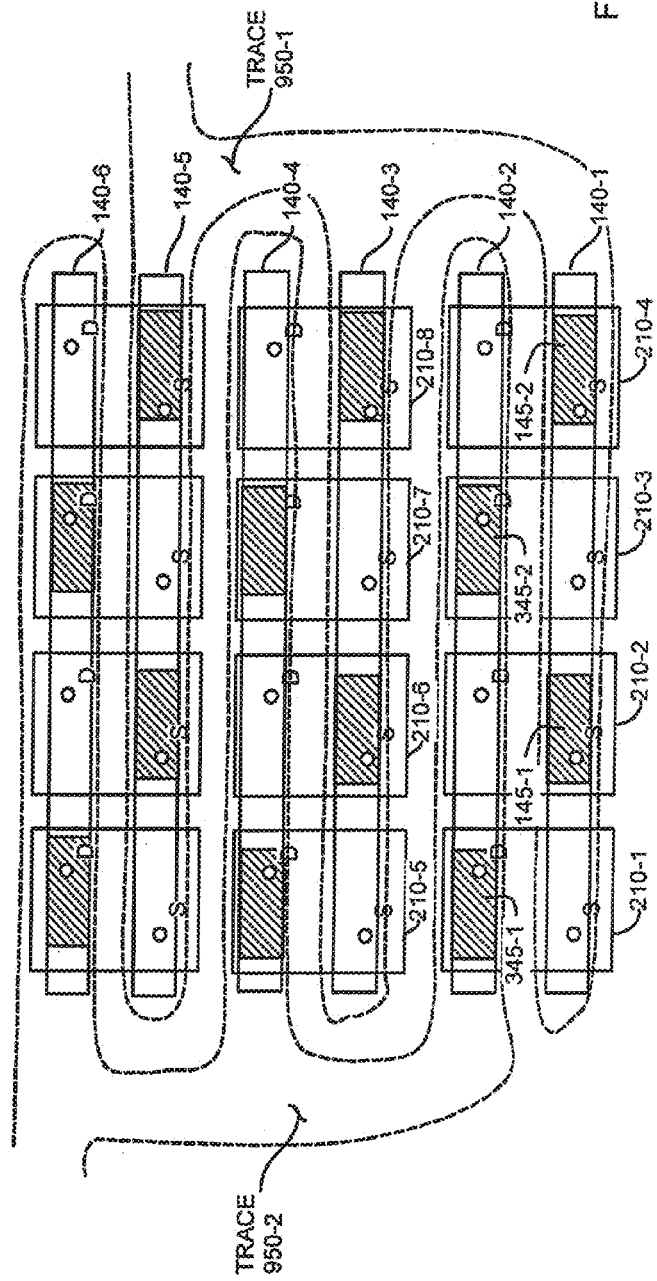
FIG. 9 is an example see-through diagram illustrating connectivity from an electrical circuit, through a leadframe package, to a substrate according to embodiments herein.

FIG. 9 is an example transparent view diagram illustrating interconnectivity of electrical circuit 120 to corresponding traces of a circuit board via a leadframe device 190 according to embodiments herein. As shown, traces 950 can be electrically isolated from each other so as not to short drains to sources. Each of traces 950 can be a route, surface pad, conductive strip, etc., on a host such as a printed circuit board.

As previously discussed, each of circuits 210 can be configured by interconnecting an array of field effect transistors to produce a respective field effect transistor switch circuit. Thus, as previously discussed, circuit 210-1 can be a first field effect transistor switch circuit, circuit 210-2 can be a second field effect transistor switch circuit, circuit 210-3 can be a third field effect transistor switch circuit, circuit 210-4 can be a fourth field effect transistor switch circuit, circuit 210-5 can be a fifth field effect transistor switch circuit, circuit 210-6 can be a sixth field effect transistor switch circuit, circuit 210-7 can be a seventh field effect transistor switch circuit, circuit 210-8 can be an eighth field effect transistor switch circuit, and so on.

As shown, and as previously discussed, the circuits 210 of electrical circuit 120 reside at a topmost level (e.g., connection interface 110-1) of the transparent view. At connection interface 110-1 (see also FIG. 1), each circuit 210 connects to a corresponding conductive path 140 beneath it. For example, source node of circuit 210-1 connects to conductive path 140-1; source node of circuit 210-2 connects to conductive path 140-1; source node of circuit 210-3 connects to conductive path 140-1; and so on. Drain node of circuit 210-1 connects to conductive path 140-2; drain node of circuit 210-2 connects to conductive path 140-2; drain node of circuit 210-3 connects to conductive path 140-2; and so on. As previously discussed, the source nodes and drain nodes of each respective circuit can be electrically isolated from each other except for respective electrical connections provided by the conductive paths 140.

In a similar manner as shown, source node of circuit 210-5 connects to conductive path 140-3; source node of circuit 210-6 connects to conductive path 140-3; source node of circuit 210-7 connects to conductive path 140-3; and so on. Drain node of circuit 210-5 connects to conductive path 140-4; drain node of circuit 210-6 connects to conductive path 140-4; drain node of circuit 210-7 connects to conductive path 140-4; and so on.

Connection interface 110-2 provides connectivity between the contact elements (cross-hatched regions of conductive paths 140) of leadframe device 190 and the circuit board or substrate on which traces 950 reside. Conductive path 140-1 includes contact elements 145-1 and 145-2 for connecting to printed circuit board trace 950-1; Conductive path 140-2 includes contact elements 345-1 and 345-2 for connecting to printed circuit board trace 950-2; and so on.

In a similar manner, conductive path 140-3 includes contact elements that connect to printed circuit board trace 950-1. Conductive path 140-4 includes contact elements that connect to printed circuit board trace 950-2. Conductive path 140-5 includes contact elements that connect to printed circuit board trace 950-1. Conductive path 140-6 includes contact elements that connect to printed circuit board trace 950-2.

Accordingly, the source nodes (as shown in FIG. 9) of the electrical circuits 210 in package 100 get connected (via connection interface 110-2) to printed circuit board trace 950-1 via conductive paths 140-1, 140-3, and 140-5. The drain nodes (as shown in FIG. 9) of the electrical circuits 210 in package 100 get connected (via connection interface 110-2) to printed circuit board trace 950-2 via conductive paths 140-2, 140-4, and 140-6.

Each of the conductive paths 140 can be electrically isolated from each other until connected to a host substrate. After forming a physical connection between the leadframe device 190 and host as discussed above, the conductive paths 140-1, 140-3, 140-5 become electrically connected via trace 950-1. After forming a physical connection as discussed above, the conductive paths 140-2, 140-4, 140-6 become electrically connected via trace 950-2. Thus, the conductive path 140-1 and conductive path 140-3 are electrically isolated from each other except for or until electrical coupling between the conductive path 140-1 and the conductive path 140-3 provided by the trace 950-1 (e.g., route) in the substrate; the conductive path 140-2 and the conductive path 140-4 are electrically isolated from each other except for electrical coupling between the conductive path 140-2 and the conductive path 140-4 provided by the trace 950-2 (e.g., route) in the substrate; and so on.

Via application of a gate signal to the circuits 210, the switch circuits 210 provide a low impedance path or high impedance path between trace 950-1 and trace 950-2. More specifically, an OFF gate signal causes the circuits 210 to provide a high impedance path. An ON gate signal causes the circuits to provide a low impedance path.

Control signals for driving switch can be generated internally with respect to the electrical circuit 120 or received off-chip via signals on the host substrate that are passed up to the electrical circuit 120 via conductive paths in the leadframe device 190. In one embodiment, a driver circuit 410 disposed on electrical circuit 120 can be configured to generate the switch control signals based on receipt of an input signal. The input signal can be received by the driver circuit 410 from the circuit board substrate via one or more conductive path in the leadframe device 190 between the host substrate and the driver circuit.

Figure 10:
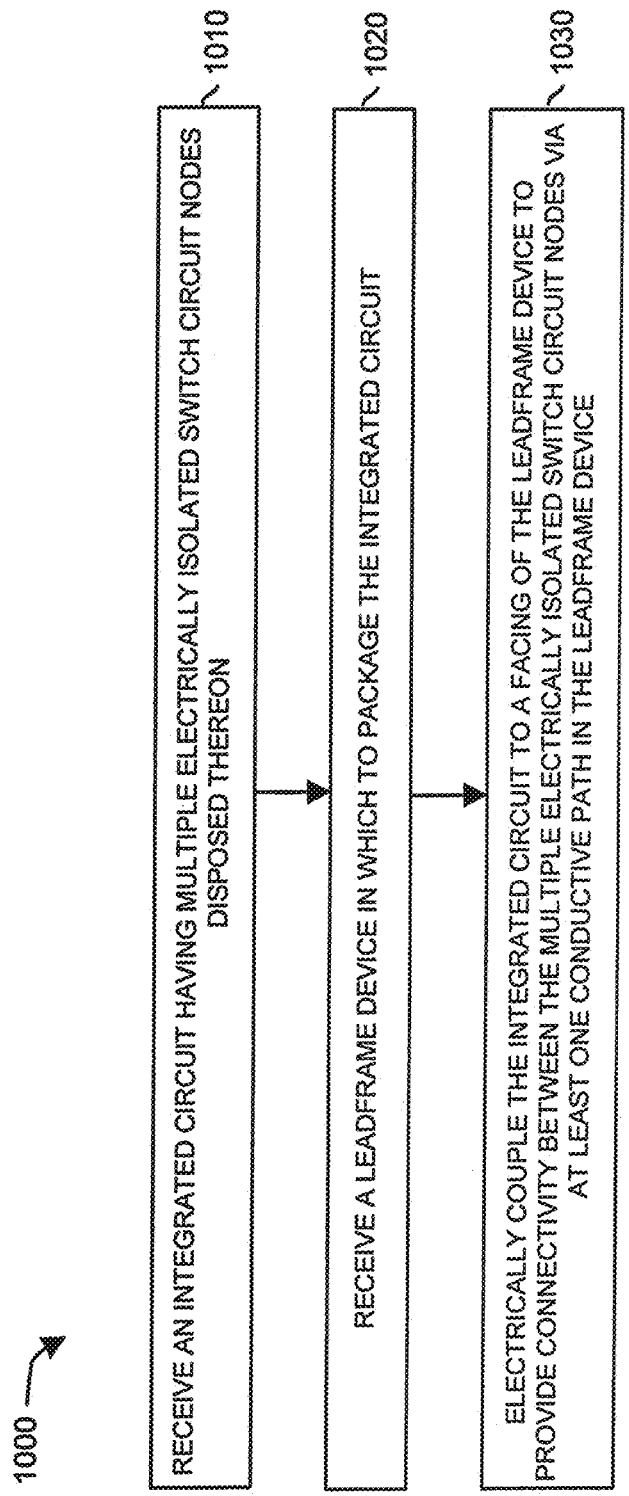
FIG. 10 is a flowchart illustrating an example method supporting generation of a package including a leadframe and an electrical circuit according to embodiments herein.

FIG. 10 is a flowchart 1000 illustrating an example method of packaging an electrical circuit 120 in a leadframe device 190 according to embodiments herein. Note that there will be some overlap with respect to concepts discussed above for FIGS. 1 through 9.

Step 1010 includes receiving an electrical circuit 120 such as an integrated circuit having multiple electrically isolated switch circuit nodes disposed thereon.

Step 1020 includes receiving a leadframe device 190 in which to package the integrated circuit.

Step 1030 includes electrically coupling the integrated circuit to a facing 150-1 of the leadframe device 190 to provide connectivity between the multiple electrically isolated switch circuit nodes of electrical circuit 120 via at least one conductive path 140 in the leadframe device 190.

Figure 11:
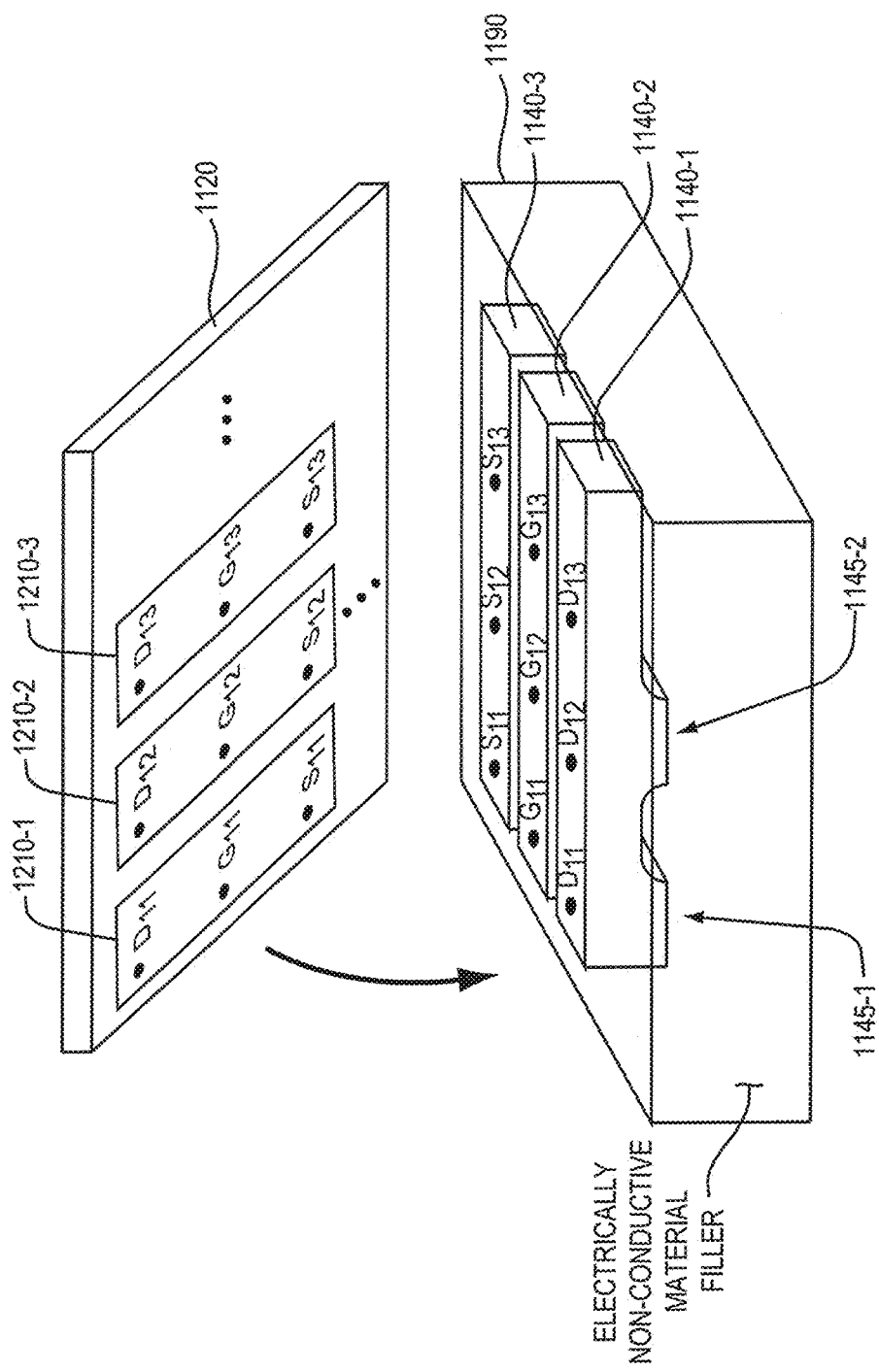
FIG. 11 is an example 3-D diagram illustrating coupling of a electrical circuits to a corresponding leadframe according to embodiments herein.

FIG. 11 is an example 3-D diagram illustrating coupling of a independent electrical circuits 1210 to a corresponding leadframe according to embodiments herein.

As shown, the electrical circuit 1120 can be configured to include multiple switch circuits that are completely independent with respect to each other. For example, instead of being driven by a gate signal produced on the electrical circuit 1120, each of circuits 1210-1, 1210-2, 1210-3, etc. can include a gate signal that is not tied to the gate signal of other circuits 1210. Thus, each switch circuit 1210 can be individually controlled. However, as shown in FIG. 11, the leadframe device 1190 can include conductive paths 1140 to provide electrical connections between the drains, gates and sources of each circuit 1210. For example, when packaged in leadframe device 1190, conductive path 1140-1 electrically connects drains D11, D12, D13, etc. together; conductive path 1140-2 electrically connects gates G11, G12, G13, etc. together; conductive path 1140-3 electrically connects drains S11, S12, S13, etc. together. Thus, leadframe device 1190 can be configured to provide connectivity between independent nodes of different circuits or provide connectivity between multiple independent circuits.

Figure 12:
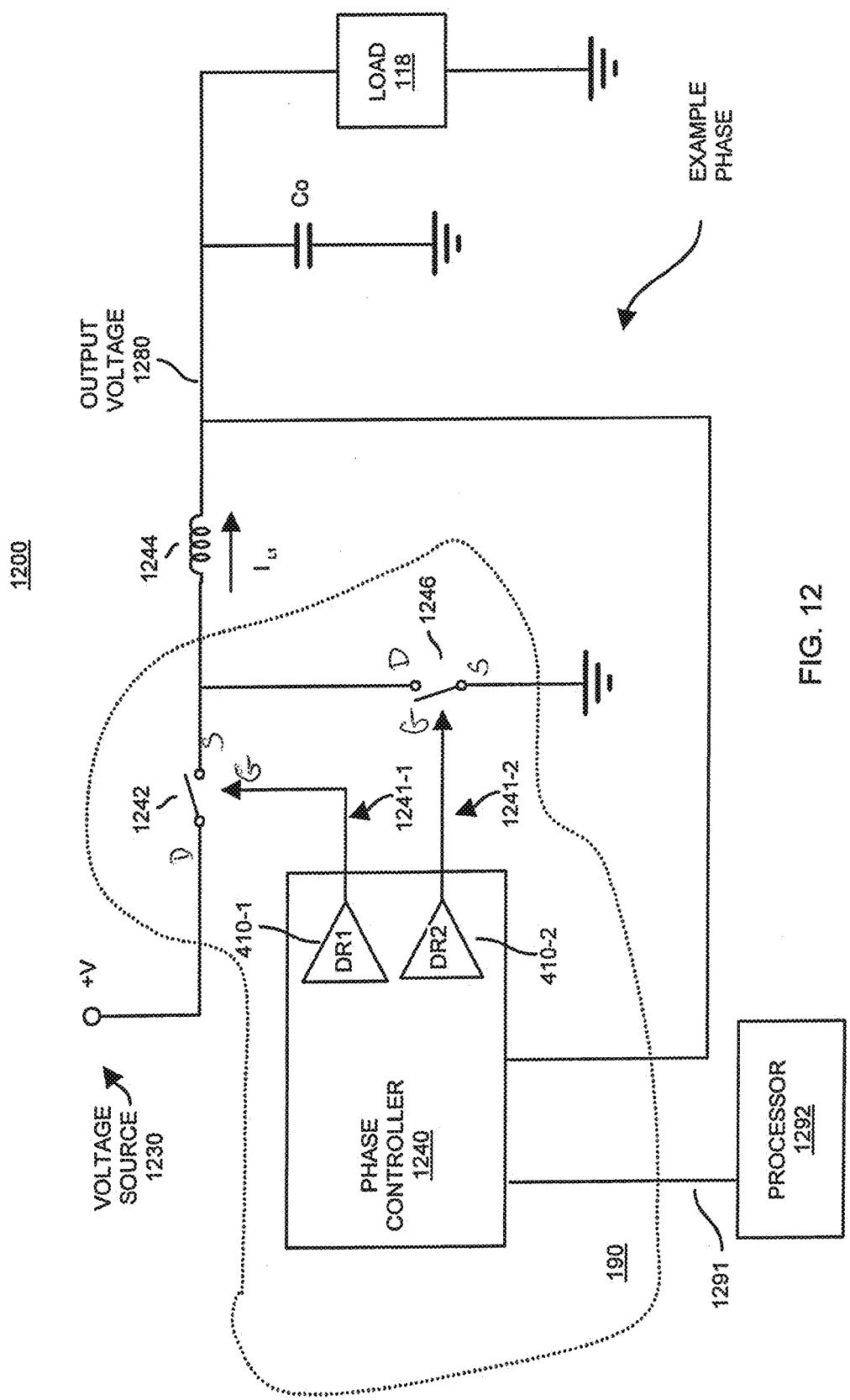
FIG. 12 is a diagram illustrating functionality provided by an example leadframe device and related components according to embodiments herein.

FIG. 12 is a diagram illustrating functionality associated with an example leadframe device 190 of a power supply system 1200 according to embodiments herein.

More specifically, a leadframe device 190 populated according to embodiments herein can be configured to include a phase controller 1240 (e.g., controller logic), a control driver 410 (e.g., control driver 410-1 and control driver 410-2), as well as any other conventional circuitry to control an output voltage applied to power load 118.

In such an embodiment, phase controller 1240 monitors the output voltage 1280 and generates appropriate control signals for driving high side switch circuitry 1242 and low side switch circuitry 1246 in the leadframe device 190. The high side switch circuitry 1242 and low side switch circuitry 1246 of power supply system 1200 represent the functionality provided by connection of circuits 210 (on circuit 120) via conductive paths 140 to a host such as a printed circuit board as described herein.

As previously discussed, additional conductive paths in the leadframe device 190 can provide connectivity between circuit 120 and a respective printed circuit board. Accordingly, any portion or functionality of a power supply system 1200 can reside in leadframe device 190 rather than on the printed circuit board. A benefit of such a configuration is space savings. Typically, conventional power supplies require layout of many components on a respective printed circuit board to create a power supply. This requires considerable printed circuit board real estate and cost to assemble. In contrast to conventional techniques, inclusion of control circuitry and/or related circuitry on leadframe device 190 as described herein can reduce an overall impact of populating a printed circuit board with a power supply control system because a printed circuit board can be populated with one or more leadframe devices rather than a multitude of individual components.

Again, each of the high side switch circuitry 1242 and low side switch circuitry 1246 of leadframe device 190 can be configured in accordance with the techniques as discussed herein with respect to FIGS. 1-11. More specifically, in an example embodiment, a first set of conductive paths 140 in the leadframe device 190 can provide connectivity amongst multiple circuits 210 of circuit 120 to produce high side switch circuitry 1242; a second set of conductive paths 140 in the leadframe device 190 can provide connectivity amongst multiple circuits 210 in circuit 120 to produce low side switch circuitry 1246; and so on. As previously discussed, the leadframe device 190 includes contact elements 145 for connecting the switch circuitry to a printed circuit board.

Each phase in power supply system 1200 can require a respective independently operating high side switch and low side switch. The leadframe device 190 can be configured to provide switching circuitry for each of a number of phases. Thus, in certain embodiments, the leadframe device 190 can include a multi-phase power supply controller and related circuitry.

In addition to including control driver 410 as discussed above in FIG. 4A, note that circuit 120 can include phase controller 1240 for monitoring output voltage 1280 and producing phase control signals to control respective high side switch circuitry 1242 and low side switch circuitry 1246 for the embodiment as discussed in FIG. 12. Accordingly, the leadframe device 190 can include any suitable circuits to facilitate generation of output voltage 180.

Additionally, note that the leadframe device 190 can be configured to include a conductive path from circuit 120 to communication link 1291 on a printed circuit board such that the phase controller 1240 and processor 1292 (also on circuit board) can communicate with each other. In one embodiment, the output voltage 180 can be used to power the processor 1292.

As shown in the example embodiment of FIG. 12, during operation, phase controller 1240 generates control signal 1241-1 to control respective high side switch circuitry 1242 and control signal 1241-2 to control low side switch circuitry 1246. When high side switch circuitry 1242 is turned ON via controller 1240 (while low side switch circuitry 1246 is OFF), the current through inductor 1244 increases via a conductive path provided by high side switch circuitry 1242 between voltage source 1230 and inductor 1244. When low side switch circuitry 1246 is turned ON via controller 1240 (while high side switch circuitry 1242 is OFF), the current through inductor 1244 decreases based on a conductive path through the low side switch circuitry 1246 between the inductor 1244 and ground.

As mentioned above, based on switching of the high side switch circuitry 1242 and the low side switch circuitry 1246, the leadframe device 190 (e.g., a power supply control system) can regulate the output voltage 1280 within a desired range for providing power to load 118.

In one embodiment, leadframe device 190 can include respective circuitry to control any number of phases present in leadframe device 190 of a power supply system 1200. Each phase can include high side switch circuitry and low side switch circuitry as previously discussed. To deactivate a respective phase, the phase controller 1240 can set both high side switch circuitry 1242 and low side switch circuitry 1246 of the phase to an OFF state.

Figure 13:
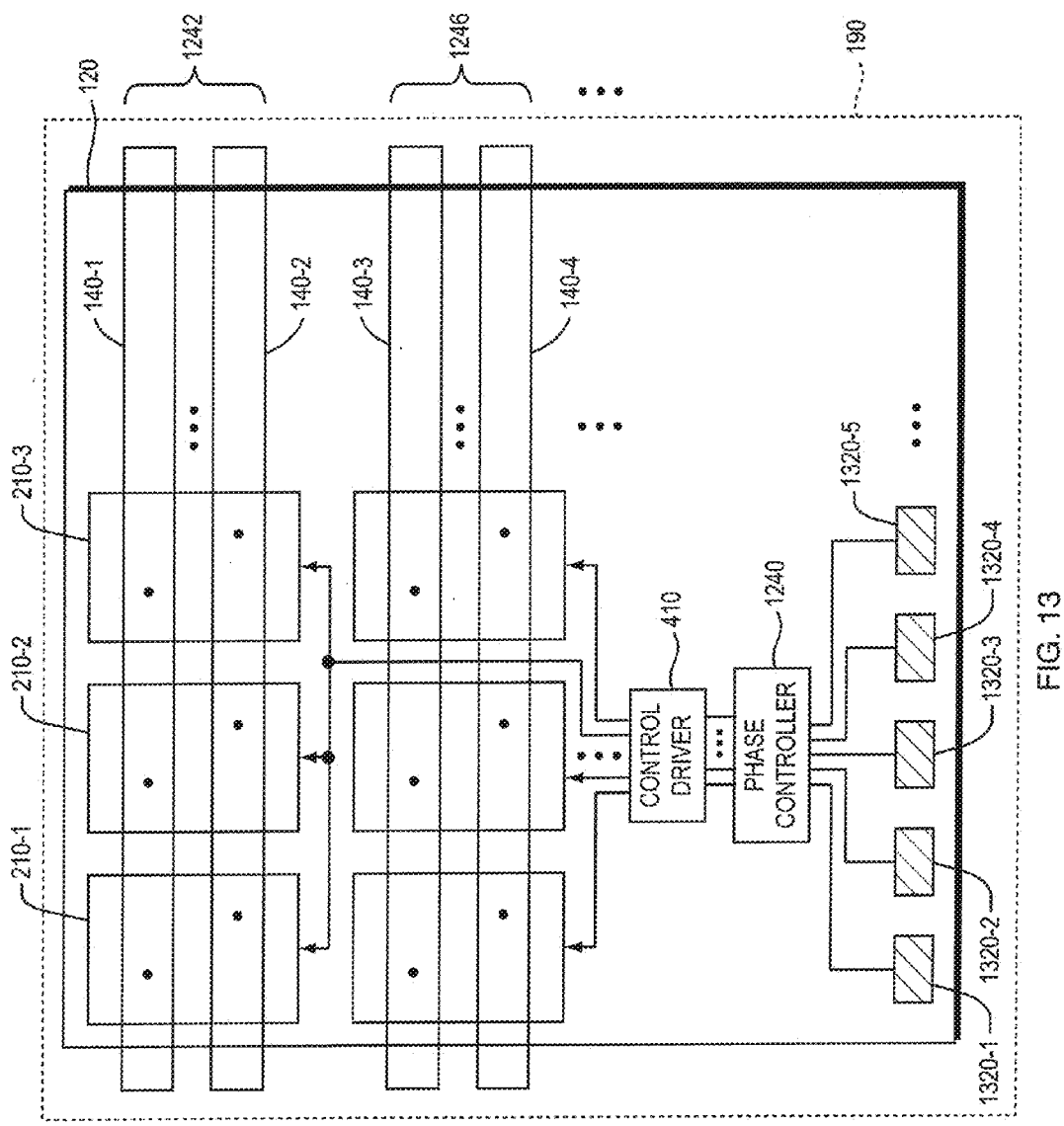
FIG. 13 is a diagram illustrating packaging of components in an example leadframe device according to embodiments herein.

FIG. 13 is a diagram illustrating an example leadframe device 190 according to embodiments herein. As shown, conductive paths 140 in leadframe device 190 provide connectivity amongst a number of transistor arrays (e.g., multiple transistors connected in parallel as discussed above) to provide high and low side switching capability for each of one or more phases supported by the leadframe device 190. As previously discussed, the leadframe device 190 according to embodiments herein can provide connectivity with signals on a host circuit board via conductive paths through the leadframe device 190. In this example configuration of FIG. 13, conductive path 1320-1, conductive path 1320-2, conductive path 1320-3, conductive path 1320-4, conductive path 1320-5, etc., provide connectivity from the circuit 120 through the leadframe device 190 to a respective circuit such as a host on which the leadframe device 190 resides. Accordingly, via such connectivity, any components previously mounted to a host circuit board can be located on the leadframe device 190 instead.

As mentioned above, different families or sizes of leadframe devices can be manufactured using different numbers of circuits 210 (e.g., switch tiles 210). For example, a number circuits included in a leadframe device 190 can vary by adding or removing rows and/or columns of tiles of an integrated circuit that is subsequently packaged in a leadframe device. In accordance with a first specification, embodiments herein include: receiving a first integrated circuit, the first integrated circuit having a first set of electrically isolated switch circuit nodes disposed thereon; receiving a first leadframe device in which to package the first integrated circuit; and electrically coupling the first integrated circuit to a facing of the first leadframe device to provide connectivity between the first set of electrically isolated switch circuit nodes on the first integrated circuit via at least one conductive path in the first leadframe device.

In accordance with a second specification that is modified or different with respect to the first specification, embodiments herein include: receiving a second integrated circuit, the second integrated circuit having a second set of electrically isolated switch circuit nodes disposed thereon, the second integrated circuit having a different number of electrically isolated switch circuit nodes than the first integrated circuit; receiving a second leadframe device in which to package the second integrated circuit; and electrically coupling the second integrated circuit to a facing of the second leadframe device to provide connectivity between the second set of electrically isolated switch circuit nodes via at least one conductive path in the second leadframe device. Thus, a number of switch tiles can be added or removed from design to design to create different families of devices.

Figure 14:
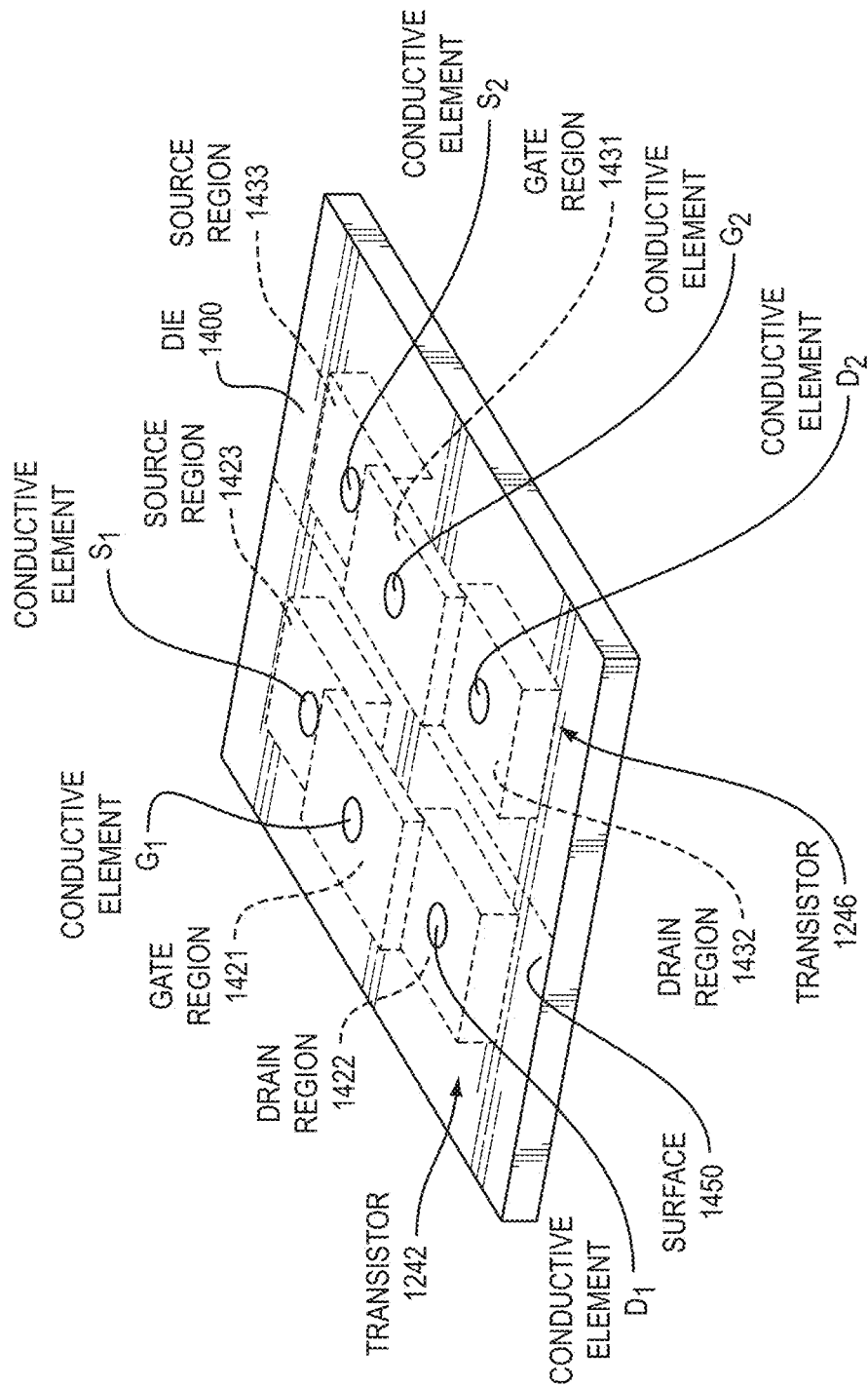
FIG. 14 is an example perspective view illustrating a die including multiple transistors according to embodiments herein.

FIG. 14 is an example perspective view illustrating a die including multiple transistors according to embodiments herein.

As shown, die 1400 (such as a semiconductor die) includes a first transistor 1242 and a second transistor 1246. A surface 1450 of the die 1400 (such as a flip-chip) includes multiple exposed conductive elements G1, S1, D1, G2, S2, and D2.

The conductive elements on surface 1450 can be fabricated from any suitable conductive material. By way of a non-limiting example, the conductive elements are fabricated from solder and facilitate mounting of nodes on the surface 1450 of die 1400 to a respective host substrate such as a printed circuit board, lead frame device, electronic circuit package, etc.

The conductive elements on the surface 1450 of die 1400 are electrically coupled to respective nodes of the first transistor 1242 and the second transistor 1246. For example, the exposed conductive element G1 of die 1400 is electrically connected to gate region 1421 of transistor 1242 disposed within die 1450; the exposed conductive element S1 of die 1400 is electrically connected to source region 1423 of transistor 1242 disposed within die 1400; the exposed conductive element D1 of die 1400 is electrically connected to drain region 1422 of transistor 1242 disposed within die 1450.

The exposed conductive element G2 of die 1400 is electrically connected to gate region 1431 of transistor 1246 disposed within die 1450; the exposed conductive element S2 of die 1400 is electrically connected to source region 1433 of transistor 1246 disposed within die 1400; the exposed conductive element D1 of die 1400 is electrically connected to drain region 1422 of transistor 1242 disposed within die 1450.

In one embodiment, each of the nodes (such as gate, source, drain nodes) of the transistors is electrically isolated from other nodes. As a non-limiting example, if desired, conductive element G1 can be connected only to gate region 1421 disposed within die 1400; conductive element D1 can be connected only to drain region 1422 disposed within die 1400; conductive element S1 can be connected only to source region 1423 disposed within die 1400; conductive element G2 can be connected only to gate region 1431 disposed within die 1400; conductive element D2 can be connected only to drain region 1432 disposed within die 1400; conductive element S2 can be connected only to source region 1433 disposed within die 1400.

FIG. 15A is an example diagram illustrating a side view of a die according to embodiments herein.

As shown, each of the conductive elements can be coupled to a respective transistor node via a respective conductive path disposed within the die 1400. For example, conductive element D1 of transistor 1242 can be electrically coupled to drain region 1422 (a doped region in die 1400) via a respective conductive path 1522 (fabricated from a material such as metal); conductive element G1 can be electrically coupled to gate region 1421 via a respective conductive path 1521 (fabricated from a material such as metal); conductive element S1 can be electrically coupled to source region 1423 (a doped region in die 1400) via a respective conductive path 1523 (fabricated from a material such as metal); and so on.

In one embodiment, the conductive elements on surface 1450 of die 1400 can be sufficiently spaced apart from each other via one or more conductive paths extending longitudinally from a respective conductive element to a respective doped region. The conductive elements need not be dispose directly over a respective doped region. Transistor 1242 can be configured in a similar manner.

Figure 15B:
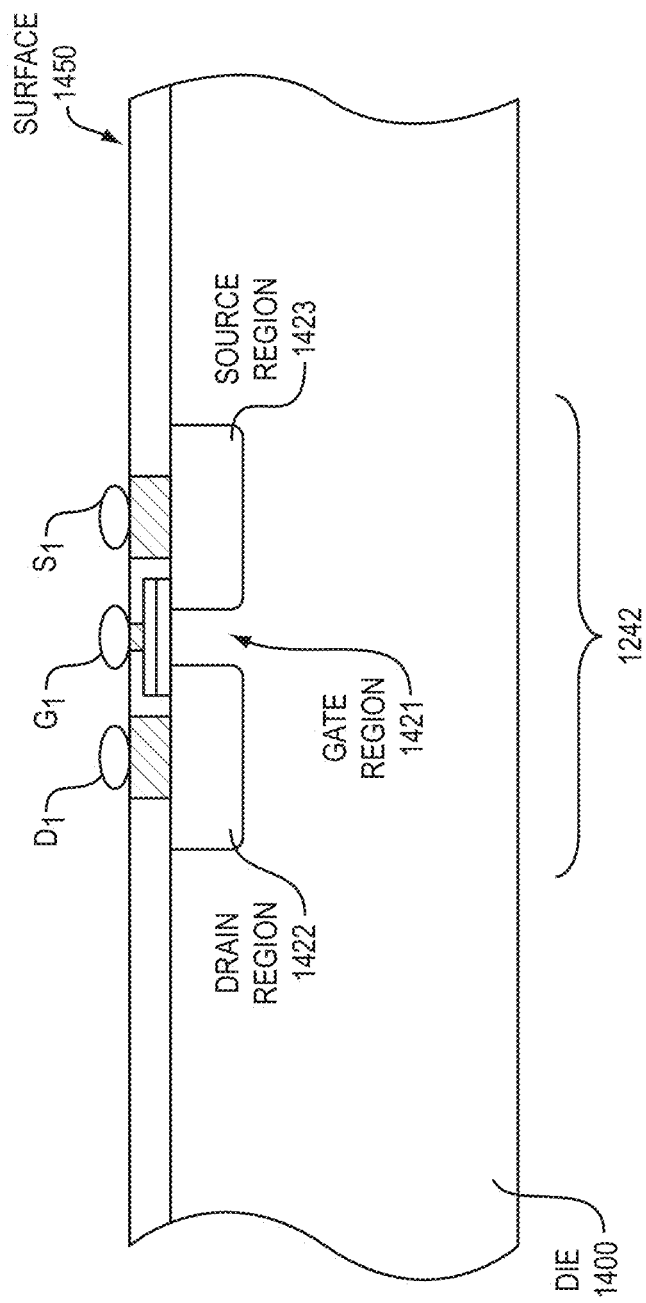
FIG. 15B is an example diagram illustrating a side view of a die according to embodiments herein.

FIG. 15B is an example diagram illustrating a side view of a die according to embodiments herein.

As previously discussed, each of the conductive elements can be coupled to a respective transistor node via a respective conductive path disposed within the die 1400. In one embodiment, as shown, a respective conductive element can be disposed over a respective transistor region. For example, in one non-limiting embodiment, conductive element D1 can be substantially disposed over drain region 1422; conductive element G1 can be substantially disposed over gate region 1421; conductive element S1 can be substantially disposed over source region 1423; and so on. Transistor 1246 can be configured in a similar manner such that conductive element D2 is substantially disposed over a respective drain region of transistor 1246; conductive element G2 is substantially disposed over a respective gate region of transistor 1246; conductive element S1 is substantially disposed over a respective source region of transistor 1246; and so on.

Figure 16:
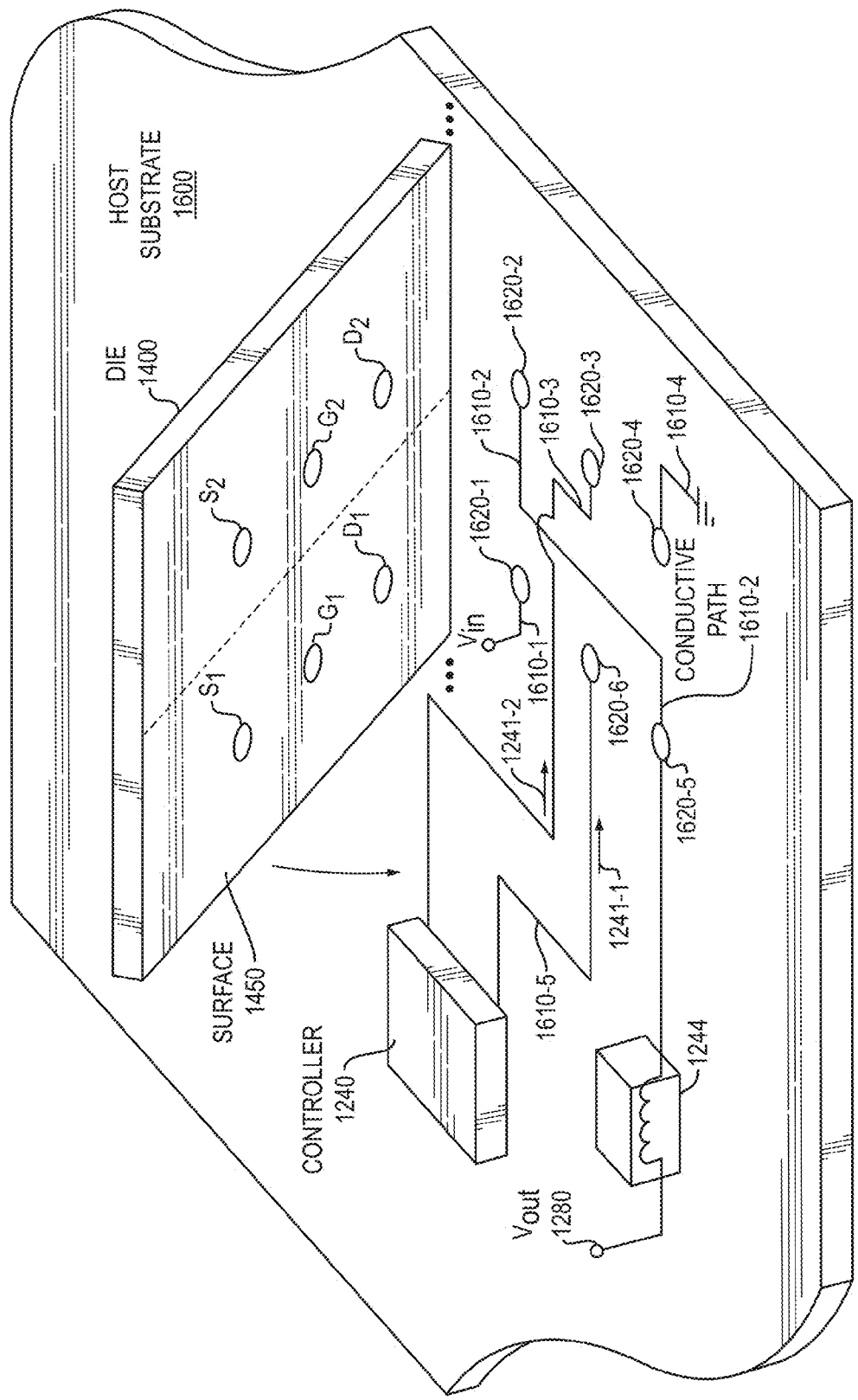
FIG. 16 is an example diagram illustrating mounting of a die onto a respective host substrate according to embodiments herein.

FIG. 16 is an example diagram illustrating mounting of a die onto a respective host substrate according to embodiments herein.

As shown, the surface 1450 of die 1400 can be flipped and mounted directly or indirectly on a respective exposed facing of host substrate 1600. In such an embodiment, the conductive elements of the die 1400 make direct contact with respective pads (such as metallic material) disposed on host substrate 1600.

More specifically, when positioned properly, the conductive element S1 contacts pad 1620-5 on the exposed surface of host substrate 1600; the conductive element G1 contacts pad 1620-6 on the exposed surface of host substrate 1600; the conductive element D1 contacts pad 1620-1 on the exposed surface of host substrate 1600; the conductive element S2 contacts pad 1620-4 on the exposed surface of host substrate 1600; the conductive element G2 contacts pad 1620-3 on the exposed surface of host substrate 1600; the conductive element D2 contacts pad 1620-2 on the exposed surface of host substrate 1600.

The pads 1620 disposed on exposed facing of host substrate 1600 are electrically connected to corresponding conductive elements of die 1400. For example, consistent with the power supply circuit in FIG. 12, conductive path 1610-1 in FIG. 16 (such as a trace) provides electrical connectivity between pad 1620-1 (conductive element D1) and Vin (voltage source 1230); conductive path 1610-2 provides electrical connectivity between pad 1620-2 (conductive element D2) and pad 1620-5 (conductive element S1) and inductor resource 1244; conductive path 1610-3 provides electrical connectivity between pad 1620-3 (conductive element G2) and driver DR2 in controller 1240; conductive path 1610-4 provides electrical connectivity between pad 1620-4 and a respective ground potential; conductive path 1610-5 provides electrical connectivity between pad 1620-6 (conductive element G1) and driver DR1 in controller 1240.

Thus, the surface 1450 of the die 1450 and corresponding conductive elements can be mounted directly on the host substrate 1600.

Subsequent to fabrication, via control signals 1241-1 and 1241-2, the controller 1240 controls a state of switches 1242 and 1246 to produce output voltage 1280 within a desire range.

As previously discussed, as an alternative to direct mounting, the surface 1450 of the die 1400 can be directly coupled to an electronic circuit package. The electronic circuit package provides connectivity between the respective nodes of die 1400 and the facing of the host substrate.

Further as previously discussed, transistor 1242 in die 1400 can be electrically isolated from the transistor 1246 prior to mounting of the surface 1450 of the die 1400 to the facing of a respective host substrate 1600. At least one conductive path (such as conductive path 1610-2) disposed on the host substrate 1600 provides electrical connectivity between the transistor 1242 and transistor 1246.

Note that, if desired, the die 1400 can include one or more conductive paths extending between respective transistors. For example, in one embodiment, the transistor 1242 (such as a control switch in a switching power supply) is electrically coupled to the transistor 1246 (such as a synchronous switch in a switching power supply) via a conductive path disposed in the die 1450.

As shown in FIG. 16, power supply circuitry disposed on host substrate 1600 includes inductor element 1244. Via conductive path 1610-2, a first node of the inductor element 1244 is electrically connected to the source node (conductive element S1) of transistor 1242 and the drain node (conductive element D2) of transistor 1246.

In one embodiment, controller 1240 receives feedback of output voltage 1280 produced at a second node of the inductor element 1244. Based at least in part on the feedback, the controller 1240 controls drivers DR1 and DR2 to drive the respective gate node G1 of transistor 1242 and the gate node G2 of the transistor 1246 to produce the output voltage 1280 within a desired range.

Figure 17:
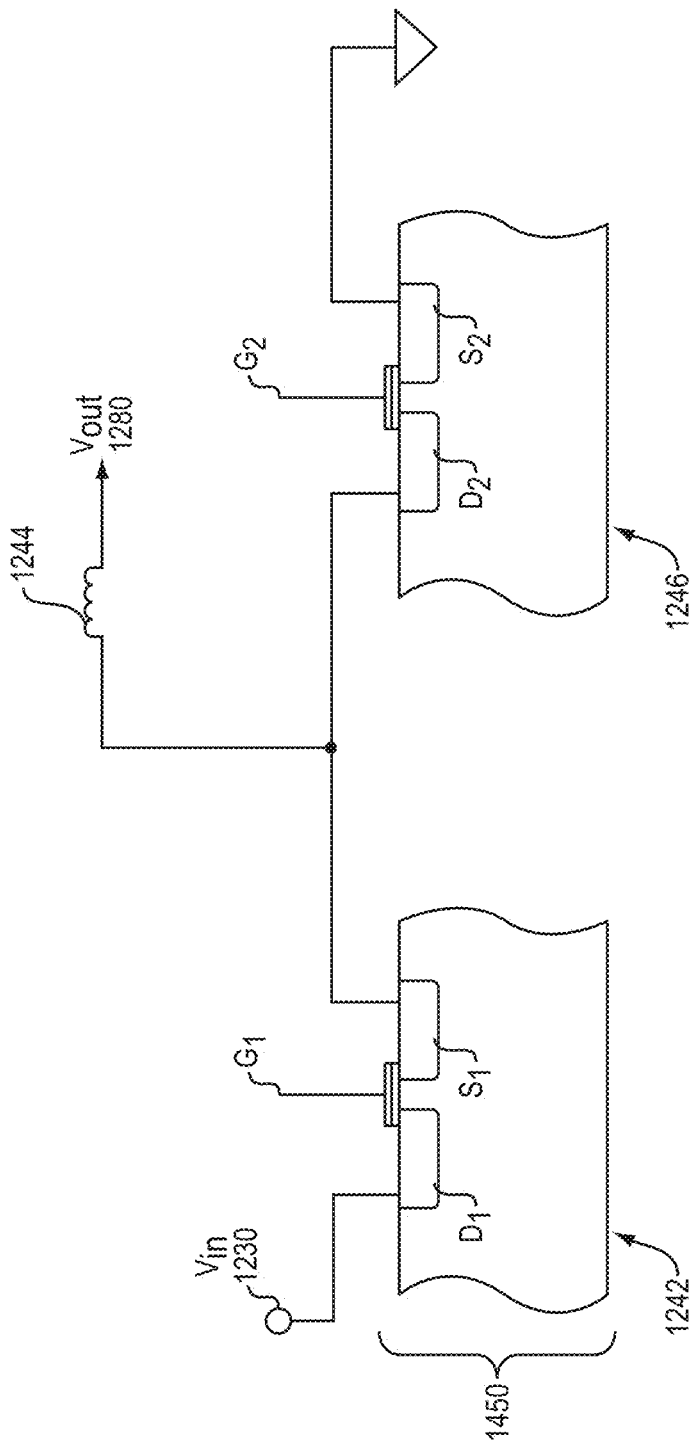
FIG. 17 is a side view diagram illustrating connectivity of nodes in a die according to embodiments herein.

FIG. 17 is a side view logical diagram illustrating connectivity of nodes in a die according to embodiments herein.

As shown, by way of a non-limiting example, to create a respective power supply circuit, drain D1 of die 1450 is electrically connected to the voltage source 1230. As previously discussed, controller 1240 drives gates G1 and G2. The source S1 and the drain D2 are electrically coupled to the inductor element 1244. Source S2 is connected to a ground node.

Figure 18:
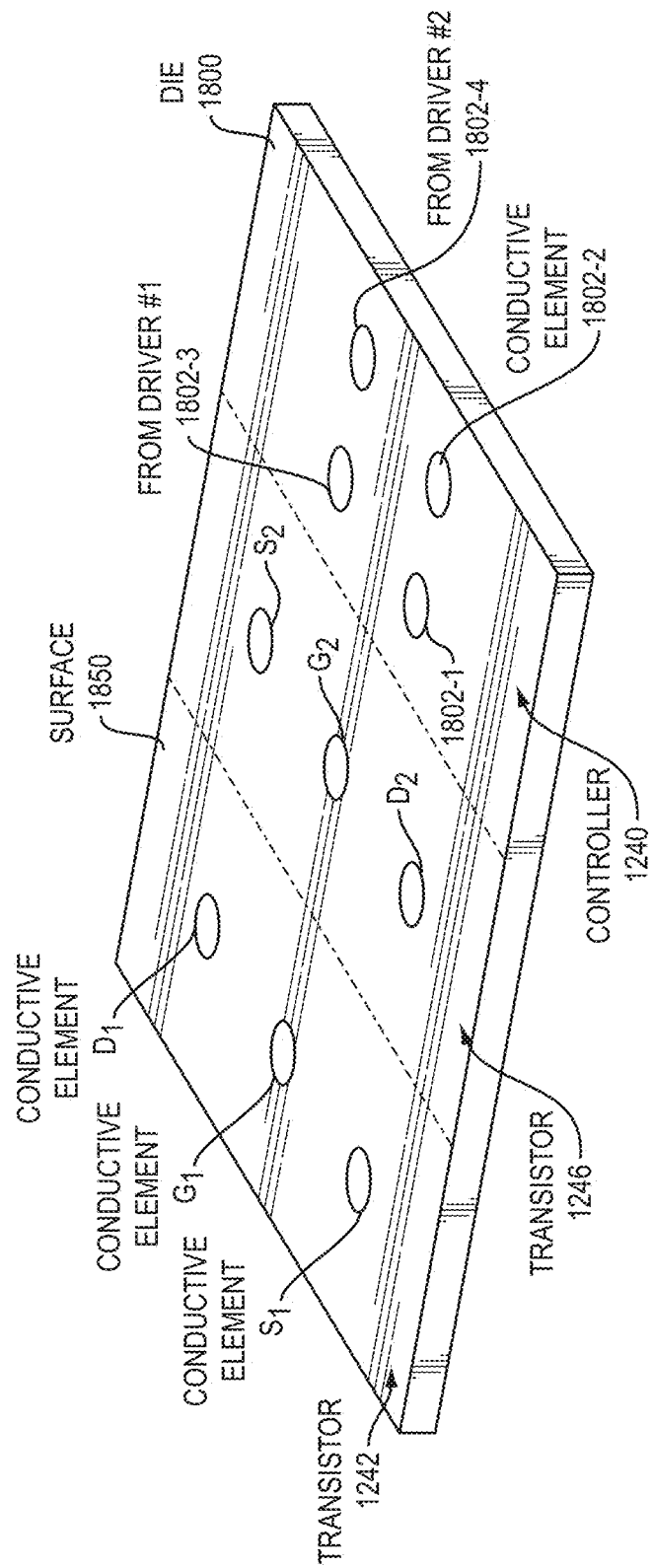
FIG. 18 is an example perspective diagram illustrating a die including multiple transistors and additional circuitry according to embodiments herein.

FIG. 18 is an example perspective diagram illustrating a die including multiple transistors and additional circuitry according to embodiments herein.

As previously discussed, die 1400 can be used to fabricate a respective power supply circuit. However, note that a respective die is not limited to including just transistors. For example, the die 1800 as shown in FIG. 18 is another example of a circuit device that can be mounted to a respective host substrate 1600. In this example, die 1800 includes transistor 1242 and transistor 1246 as well as additional circuitry such as controller 1240. Controller 1240 can be fabricated into the respective die 1800. The nodes of controller 1240 can be electrically isolated from transistor 1242 and transistor 1246.

In a similar manner as previously discussed, die 1800 can be flipped and mounted onto the respective host substrate 1600. Conductive paths (such as traces) on the host substrate 1600 provide connectivity between the conductive elements 1802 (e.g., conductive element 1802-1, conductive element 1802-2, conductive element 1802-3, conductive element 1802-4, etc.) and respective nodes in a power supply circuit including controller 1240. Accordingly, a respective die 1800 can include controller 1240.

Nodes such as conductive elements 1802 associated with the controller 1240 fabricated in die 1800 can be electrically coupled to conductive paths on the host substrate. The conductive paths on the host substrate provide connectivity of the controller 1240 in die 1800 to respective nodes (e.g., conductive elements of the transistors, voltage sources, inductor elements, etc.) in the power supply circuit.

Thus, die 1800 can be fabricated to include individual circuit components such as transistors, controllers, etc. Surface 1850 of the die 1800 can include conductive elements coupled to nodes of the respective components. Connectivity between elements in the die 1800 can occur when the die 1800 is flipped and mounted to the respective host substrate.

Figure 19:
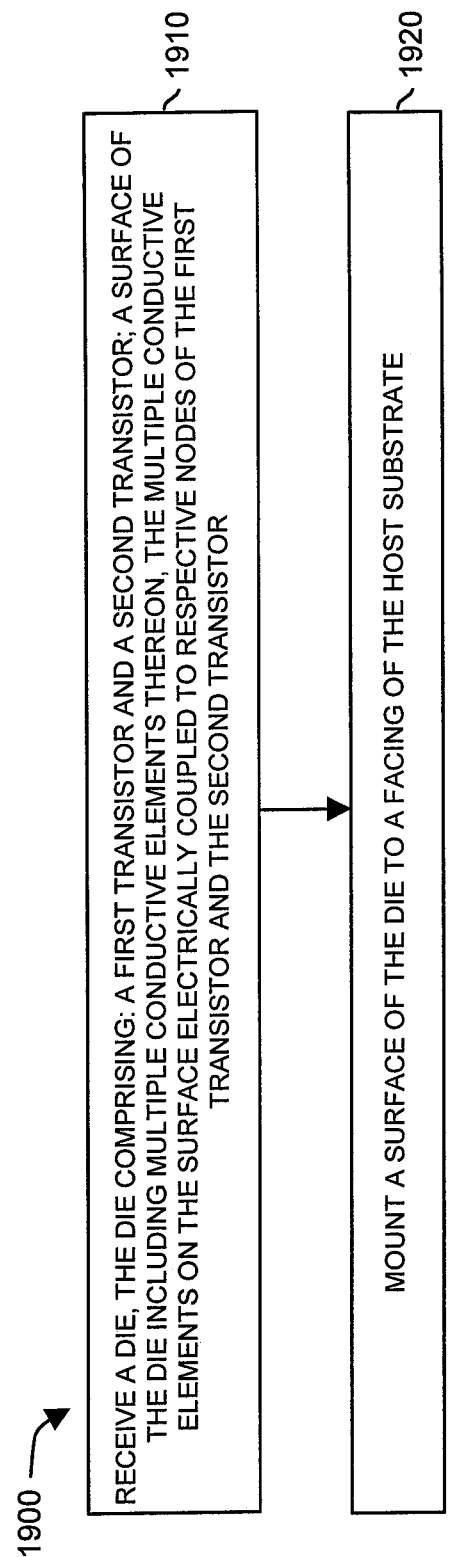
FIG. 19 is an example diagram illustrating a method flowchart illustrating assembly of a power supply circuit according to embodiments herein.

FIG. 19 is a flowchart 1900 illustrating an example method according to embodiments herein. Note that there will be some overlap with respect to concepts discussed above. For example, an assembler (such as manufacturer) installs the die 1400 on a respective host substrate to create a power supply circuit such as shown in FIG. 12.

In processing block 1910, the assembler receives a die such as die 1400. The die 1400 comprises: a first transistor 1242 and a second transistor 1246. A surface 1450 of the die 1450 includes multiple conductive elements (such as conductive element G1, S1, D1, G2, S2, . . . ) thereon. During the fabrication process, the multiple conductive elements on the surface 1450 are electrically coupled to respective nodes (e.g., gate region 1421, source region 1423, drain region 1422) of the first transistor 1242 and the second transistor 1246.

In processing block 1920, the assembler mounts a surface 1450 of the die 1400 to a facing of the host substrate 1600.

Note again that techniques herein are well suited for use in packaging electronic parts such as those that provide switching capabilities. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. An apparatus comprising:
a die comprising:
    a first transistor,
    a second transistor, and
    a surface including multiple conductive elements thereon, the multiple conductive elements on the surface electrically coupled to respective nodes of the first transistor and the second transistor;
a host substrate, the surface of the die mounted on a facing of the host substrate;
wherein the first transistor is a control switch of a switching power supply circuit and the second transistor is a synchronous switch in the switching power supply circuit.

2. The apparatus as in claim 1, wherein the surface of the die is mounted directly on the host substrate.

3. The apparatus as in claim 1, wherein the surface of the die is directly coupled to an electronic circuit package, the electronic circuit package providing connectivity between the respective nodes and the facing of the host substrate.

4. The apparatus as in claim 1, wherein the first transistor is electrically isolated from the second transistor prior to mounting of the die to the facing of the host substrate.

5. The apparatus as in claim 4, wherein at least one conductive path disposed on the host substrate provides electrical connectivity between the first transistor and the second transistor.

6. The apparatus as in claim 1, wherein the first transistor includes a gate node, a source node, and a drain node; and
wherein the second transistor includes a gate node, a source node, and a drain node.

7. The apparatus as in claim 6,
wherein the host substrate provides an electrical connection between the source node of the first transistor and the drain node of the second transistor.

8. The apparatus as in claim 7 further comprising:
an inductor element, a first node of the inductor element electrically connected to the source node of the first transistor and the drain node of the second transistor; and
a controller, the controller receiving feedback of an output voltage produced at a second node of the inductor element, the controller driving the gate node of the first transistor and the gate node of the second transistor to produce the output voltage within a desired range.

9. The apparatus as in claim 8, wherein the host substrate electrically connects an input voltage to the drain node of the first transistor.

10. An apparatus comprising:
a die comprising:
    a first transistor,
    a second transistor, and
    a surface including multiple conductive elements thereon, the multiple conductive elements on the surface electrically coupled to respective nodes of the first transistor and the second transistor; and
a host substrate, the surface of the die mounted on a facing of the host substrate;
wherein the multiple conductive elements includes:
    a first conductive element, the first conductive element electrically coupled to a respective source region of the first transistor;
    a second conductive element, the second conductive element coupled to a respective drain region of the first transistor;
    a third conductive element, the third conductive element disposed over a respective gate region of the first transistor;
    a fourth conductive element, the fourth conductive element coupled to a respective source region of the second transistor;
    a fifth conductive element, the fifth conductive element coupled to a respective drain region of the second transistor; and
    a sixth conductive element, the sixth conductive element disposed over a respective gate region of the second transistor.

11. The apparatus as in claim 1, wherein the first transistor is electrically coupled to the second transistor via a conductive path disposed in the die.

12. The apparatus as in claim 1, wherein the die includes a controller, nodes of the controller electrically coupled to conductive paths on the host substrate; and
wherein the controller is configured to control operational states of the first transistor and the second transistor via control signals transmitted over the conductive paths.

13. The apparatus as in claim 1, wherein the first transistor is a first single lateral field effect transistor disposed in the die; and
wherein the second transistor is a second single lateral field effect transistor disposed in the die.

14. A method comprising:
receiving a die, the die comprising:
    a first transistor,
    a second transistor, and
    a surface including multiple conductive elements thereon, the multiple conductive elements on the surface electrically coupled to respective nodes of the first transistor and the second transistor;
mounting a surface of the die to a facing of the host substrate; and
wherein the first transistor is a control switch of a switching power supply circuit and the second transistor is a synchronous switch in the switching power supply circuit.

15. The method as in claim 14 further comprising:
mounting the surface of the die directly onto the host substrate.

16. The method as in claim 14, wherein the surface of the die is directly coupled to an electronic circuit package, the method further comprising:
mounting the electronic circuit package to the host substrate, the host substrate providing connectivity between the respective nodes and the facing of the host substrate.

17. The method as in claim 14, wherein the first transistor is electrically isolated from the second transistor prior to mounting of the die to the facing of the host substrate, the method further comprising:
mounting the die to the facing of the host substrate to provide electrical connectivity between the first transistor and the second transistor via at least one conductive path disposed on the host substrate.

18. The method as in claim 14 further comprising:
via a first conductive path in the host substrate, providing an electrical connection between a source node of the first transistor and the drain node of the second transistor; and via a second conductive path in the host substrate, electrically connecting an input voltage to a source node of the first transistor.

19. The method as in claim 18 further comprising:
electrically connecting the source node of the first transistor and the drain node of the second transistor to a first node of an inductor element; and
electrically connecting a controller to a gate node of the first transistor and a gate node of the second transistor, the controller configured to produce an output voltage at a second node of the inductor to be within a desired range.

20. The method as in claim 14, wherein the die includes a controller circuit, the method further comprising:
via conductive paths in the host substrate, electrically coupling the respective nodes of the die to the controller, the controller is configured to control operational states of the first transistor and the second transistor via control signals transmitted over the conductive paths.

21. The apparatus as in claim 1, wherein the multiple conductive elements on the surface of the die contact respective nodes on the host substrate; and
wherein the control switch is electrically isolated from the synchronous switch prior to mounting of the die to the facing of the host substrate, a conductive path in the host substrate providing connectivity between a source node of the control switch and a drain node of the synchronous switch.

22. The apparatus as in claim 21 further comprising:
an inductor, the inductor including a first terminal and a second terminal, the first terminal of the inductor electrically coupled to the conductive path in the host substrate providing circuit connectivity between the source node and the drain node, a second terminal of the inductor configured to produce an output voltage to power a load.

23. The apparatus as in claim 21, wherein the die includes a controller circuit, conductive paths in the host substrate electrically coupling a gate node of the control switch and a gate node of the synchronous switch to the controller, the controller configured to control operational states of the control switch and the synchronous switch via control signals transmitted over the conductive paths.

24. The apparatus as in claim 23, wherein the control switch is a first lateral field effect transistor disposed in the die; and
wherein the synchronous switch is a second lateral field effect transistor disposed in the die.

* * * * *